(12) United States Patent
Bamesberger et al.

(10) Patent No.: US 12,282,251 B2
(45) Date of Patent: Apr. 22, 2025

(54) METHOD OF SHAPING A SURFACE, SHAPING SYSTEM, AND METHOD OF MANUFACTURING AN ARTICLE

(71) Applicant: CANON KABUSHIKI KAISHA, Tokyo (JP)

(72) Inventors: Seth J. Bamesberger, Austin, TX (US); Byung-Jin Choi, Austin, TX (US); Xiaoming Lu, Cedar Park, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 599 days.

(21) Appl. No.: 17/484,495

(22) Filed: Sep. 24, 2021

(65) Prior Publication Data

US 2023/0095200 A1 Mar. 30, 2023

(51) Int. Cl.
*G03F 7/00* (2006.01)
*H01L 21/3105* (2006.01)

(52) U.S. Cl.
CPC ...... *G03F 7/0002* (2013.01); *H01L 21/31051* (2013.01)

(58) Field of Classification Search
None
See application file for complete search history.

(56) References Cited

U.S. PATENT DOCUMENTS

| | | | | |
|---|---|---|---|---|
| 2010/0025878 A1* | 2/2010 | Uchida | .................. | G11B 5/743 264/293 |
| 2014/0138875 A1* | 5/2014 | Torii | ..................... | G03F 7/0002 264/293 |
| 2017/0057154 A1 | 3/2017 | Hayashi | | |
| 2018/0011400 A1 | 1/2018 | Shiode | | |
| 2019/0250507 A1* | 8/2019 | Yoshida | .................. | B29C 59/02 |
| 2019/0317397 A1* | 10/2019 | Sato | ....................... | G03F 7/0002 |
| 2020/0142299 A1* | 5/2020 | Norikane | .............. | G03F 7/0002 |
| 2021/0050218 A1 | 2/2021 | Ozturk et al. | | |
| 2021/0050246 A1 | 2/2021 | Choi et al. | | |

FOREIGN PATENT DOCUMENTS

| KR | 20190071804 A | 6/2019 |
|---|---|---|
| KR | 20210098334 A | 8/2021 |
| TW | I538011 B | 6/2016 |

* cited by examiner

*Primary Examiner* — Farah Taufiq
(74) *Attorney, Agent, or Firm* — Canon U.S.A., Inc. I.P. Division

(57) ABSTRACT

A method of shaping a surface comprises dispensing formable material onto a substrate held by a substrate chuck, contacting a plate held by a plate chuck assembly with the formable material to form a film, curing the film to form a cured layer, initiating a separation front between the cured layer and the plate, tilting the plate chuck assembly and/or the substrate chuck in a direction away from the initial separation point, thereby propagating the separation front, applying a force to the plate chuck assembly and/or the substrate chuck away from the other while maintaining or increasing the tilt, until the separation front completely propagates around the cured layer, and continuing to apply the force, until the plate does not contact the cured layer. The plate chuck assembly includes a flexible portion with a central opening, and a cavity formed by the flexible portion. The plate is held by the flexible portion.

19 Claims, 27 Drawing Sheets

METHOD OF SHAPING A SURFACE, SHAPING SYSTEM, AND METHOD OF MANUFACTURING AN ARTICLE

BACKGROUND

Field of Art

The present disclosure relates to substrate processing, and more particularly, to a plate chuck assembly used in the planarization or imprinting of surfaces in semiconductor fabrication.

Description of the Related Art

Planarization and imprinting techniques are useful in fabricating semiconductor devices. For example, the process for creating a semiconductor device includes repeatedly adding and removing material to and from a substrate. This process can produce a layered substrate with an irregular height variation (i.e., topography), and as more layers are added, the substrate height variation can increase. The height variation has a negative impact on the ability to add further layers to the layered substrate. Separately, semiconductor substrates (e.g., silicon wafers) themselves are not always perfectly flat and may include an initial surface height variation (i.e., topography). One method of addressing this issue is to planarize the substrate between layering steps. Various lithographic patterning methods benefit from patterning on a planar surface. In ArFi laser-based lithography, planarization reduces the impact of depth of focus (DOF) limitations, and improves critical dimension (CD), and critical dimension uniformity. In extreme ultraviolet lithography (EUV), planarization improves feature placement and reduces the impact of DOF limitations. In nanoimprint lithography (NIL) planarization improves feature filling and CD control after pattern transfer.

A planarization technique sometimes referred to as inkjet-based adaptive planarization (IAP) involves dispensing a variable drop pattern of polymerizable material between the substrate and a superstrate, where the drop pattern varies depending on the substrate topography. A superstrate is then brought into contact with the polymerizable material after which the material is polymerized on the substrate, and the superstrate removed. Improvements in planarization techniques, including IAP techniques, are desired for improving, e.g., whole wafer processing and semiconductor device fabrication.

One step in a planarization/imprint method includes separating a plate (i.e., a superstrate or template) from a cured layer. In certain planarization and imprint systems, it may be difficult to separate the plate from a cured layer. In particular, in a planarization/imprint system including a plate chuck assembly having a flexible portion for holding the plate, it may be difficult to separate the plate from the cured layer without causing damage to the cured layer. There is a need in the art for an improved method for separating a plate from a cured layer, in particular in a planarization/imprint system where the plate is held by a flexible portion of a plate chuck assembly.

SUMMARY

A method of shaping a surface comprises dispensing formable material onto a substrate held by a substrate chuck, contacting a plate held by a plate chuck assembly with the formable material, thereby forming a film of the formable material between the plate and the substrate, curing the film of the formable material to form a cured layer between the plate and the substrate, initiating a separation front between the cured layer and the plate at an initial separation point, tilting at least one of the plate chuck assembly and the substrate chuck away from the initial separation point while the plate is held by the flexible portion, thereby propagating the separation front circumferentially along a perimeter of the cured layer, applying a force to at least one of the plate chuck assembly and the substrate chuck in a direction away from the other while maintaining or increasing the tilt of the at least one of the plate chuck assembly and the substrate chuck, until the separation front propagates along the entire perimeter of the cured layer, and continuing to apply the force to at least one of the plate chuck assembly and the substrate chuck in the direction away from the other, until the plate does not contact the cured layer. The plate chuck assembly includes a flexible portion configured to have a central opening, and a cavity formed by the flexible portion, wherein the plate is held by the flexible portion by reducing pressure in the cavity.

A shaping system comprises a plate chuck assembly configured to hold a plate, the plate chuck assembly comprising: a flexible portion configured to have a central opening, and a cavity formed by the flexible portion, wherein the plate is held by the flexible portion by reducing pressure in the cavity, a substrate chuck configured to hold a substrate, a fluid dispenser configured to dispense formable material on the substrate, a curing system configured to cure the formable material under the plate so as to form cured layer on the substrate, a separation initiator configured to initiate a separation front between the cured layer and the plate at an initial separation point, and a positioning system configured to: tilt at least one of the plate chuck assembly and the substrate chuck away from the initial separation point while the plate is held by the flexible portion, thereby propagating the separation front circumferentially along a perimeter of the cured layer, apply a force to at least one of the plate chuck assembly and the substrate chuck in a direction away from the other while maintaining or increasing the tilt of the at least one of the plate chuck assembly and the substrate chuck, until the separation front propagates along the entire perimeter of the cured layer, and continue to apply the force to at least one of the plate chuck assembly and the substrate chuck in the direction away from the other, until the plate does not contact the cured layer.

A method of manufacturing an article comprises dispensing a formable material on a substrate, contacting a plate held by a plate chuck assembly with the formable material, thereby forming a film of the formable material between the plate and the substrate, wherein the plate chuck assembly includes: a flexible portion configured to have a central opening, and a cavity formed by the flexible portion, wherein the plate is held by the flexible portion by reducing pressure in the cavity, curing the film of the formable material to form a cured layer between the plate and the substrate, initiating a separation front between the cured layer and the plate at an initial separation point, tilting at least one of the plate chuck assembly and the substrate chuck away from the initial separation point while the plate is held by the flexible portion, thereby propagating the separation front circumferentially along a perimeter of the cured layer, applying a force to at least one of the plate chuck assembly and the substrate chuck in a direction away from the other while maintaining or increasing the tilt of the at least one of the plate chuck assembly and the substrate chuck, until the separation front propagates along the entire perimeter of the cured layer, continuing to apply the force to at least one of the plate chuck assembly and the substrate chuck in the direction away from the other, until the plate does not contact the cured layer, and processing the cured formable material to make the article.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF DRAWINGS

So that features and advantages of the present disclosure can be understood in detail, a more particular description of embodiments of the disclosure may be had by reference to the embodiments illustrated in the appended drawings. It is to be noted, however, that the appended drawings only illustrate typical embodiments of the disclosure and are therefore not to be considered limiting of its scope, for the disclosure may admit to other equally effective embodiments.

While the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

DETAILED DESCRIPTION

Planarization System

Figure 1:
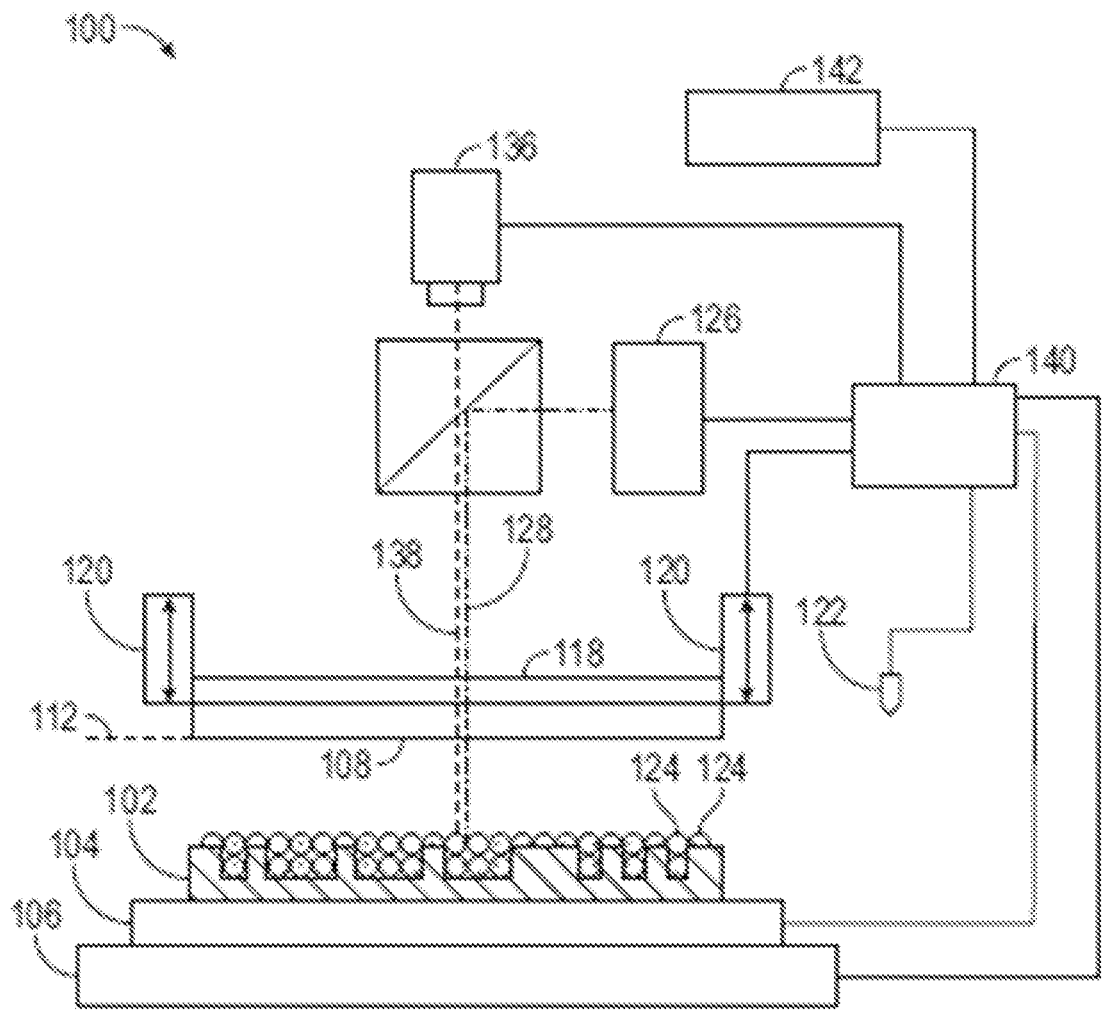
FIG. 1 is a schematic diagram illustrating an example planarization system in accordance with an aspect of the present disclosure.

FIG. 1 illustrates an example system for shaping a surface in accordance with an aspect of the present disclosure. The system for shaping a surface may be, for example, a planarization system or an imprint system. The example embodiment described herein is a planarization system 100. However, the concepts are also applicable to an imprint system. Thus, while the terminology throughout this disclosure is primarily focused on planarization, it should be understood that the disclosure is also applicable to the corresponding terminology of an imprint context.

The planarization system 100 is used to planarize a film on a substrate 102. In the case of an imprint system, the imprint system is used to form a pattern on the film on the substrate. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x-, y-, z-, θ-, ψ-, and φ-axes. The substrate positioning stage 106, the substrate 102, and the substrate chuck 104 may also be positioned on a base (not shown). The substrate positioning stage may be a part of a positioning system.

Spaced apart from the substrate 102 is a superstrate 108 (also referred herein as a plate) having a working surface 112 facing substrate 102. In the context of an imprint system, the plate is a template instead of a superstrate, where the template has a patterned surface. The superstrate 108 may be formed from materials including, but not limited to, fused silica, quartz, silicon, organic polymers, siloxane polymers, borosilicate glass, fluorocarbon polymers, metal, hardened sapphire, and/or the like. In an embodiment the superstrate is readily transparent to UV light. The working surface 112 is generally of the same areal size or slightly smaller as the surface of the substrate 108.

The superstrate 108 may be coupled to or retained by a superstrate chuck assembly 118 (also referred herein as a plate chuck assembly), which is discussed in more detail below. In the case of an imprint system, the plate chuck assembly may be referred to as a template chuck assembly. The superstrate chuck assembly 118 may be coupled to a planarization head 120 which is a part of the positioning system. In the context of an imprint system, the planarization head may be referred to as an imprint head. The planarization head 120 may be movably coupled to a bridge. The planarization head 120 may include one or more actuators such as voice coil motors, piezoelectric motors, linear motor, nut and screw motor, etc., which are configured to move the superstrate chuck 118 relative to the substrate 102 in at least the z-axis direction, and potentially other directions (e.g., x-, y-, θ-, ψ-, and φ-axis).

The planarization system 100 may further comprise a fluid dispenser 122. The fluid dispenser 122 may also be movably coupled to the bridge. In an embodiment, the fluid dispenser 122 and the planarization head 120 share one or more of all positioning components. In an alternative embodiment, the fluid dispenser 122 and the planarization head move independently from each other. The fluid dispenser 122 may be used to deposit droplets of liquid formable material 124 (e.g., a photocurable polymerizable material) onto the substrate 102 with the volume of deposited material varying over the area of the substrate 102 based on at least in part upon its topography profile. Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The planarization system 100 may further comprise a curing system that includes a radiation source 126 that directs actinic energy, for example, UV radiation, along an exposure path 128. The planarization head 120 and the substrate positioning stage 106 may be configured to position the superstrate 108 and the substrate 102 in superimposition with the exposure path 128. The radiation source 126 sends the actinic energy along the exposure path 128 after the superstrate 108 has contacted the formable material 124. FIG. 1 shows the exposure path 128 when the superstrate 108 is not in contact with the formable material 124. This is done for illustrative purposes so that the relative position of the individual components can be easily identified. An individual skilled in the art would understand that exposure path 128 would not substantially change when the superstrate 108 is brought into contact with the formable material 124.

The planarization system 100 may further comprise a camera 136 positioned to view the spread of formable material 124 as the superstrate 108 contacts the formable material 124 during the planarization process. FIG. 1 illustrates an optical axis 138 of the field camera's imaging field. As illustrated in FIG. 1, the planarization system 100 may include one or more optical components (dichroic mirrors, beam combiners, prisms, lenses, mirrors, etc.) which combine the actinic radiation with light to be detected by the camera 136. The camera 136 may include one or more of a CCD, a sensor array, a line camera, and a photodetector which are configured to gather light at a wavelength that shows a contrast between regions underneath the superstrate 108 and in contact with the formable material 124 and regions underneath the superstrate 108 but not in contact with the formable material 124. The camera 136 may be configured to provide images of the spread of formable material 124 underneath the superstrate 108, and/or the separation of the superstrate 108 from cured formable material 124. The camera 136 may also be configured to measure interference fringes, which change as the formable material 124 spreads between the gap between the working surface 112 and the substrate surface.

The planarization system 100 may be regulated, controlled, and/or directed by one or more processors 140 (controller) in communication with one or more components and/or subsystems such as the substrate chuck 104, the substrate positioning stage 106, the superstrate chuck assembly 118, the planarization head 120, the fluid dispenser 122, the radiation source 126, and/or the camera 136. The processor 140 may operate based on instructions in a computer readable program stored in a non-transitory computer memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device. All of the method steps described herein may be executed by the processor 140.

In operation, either the planarization head 120, the substrate position stage 106, or both vary a distance between the superstrate 108 and the substrate 102 to define a desired space (a bounded physical extent in three dimensions) that is filled with the formable material 124. For example, the planarization head 120 may be moved toward the substrate and apply a force to the superstrate 108 such that the superstrate contacts and spreads droplets of the formable material 124 as further detailed herein.

Planarization Process

Figure 2A:
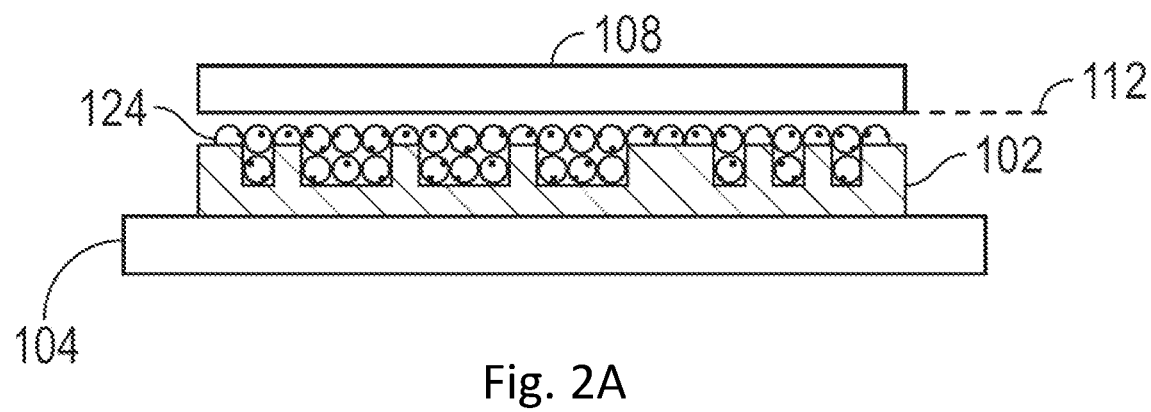
FIGS. 2A to 2C illustrate a schematic cross section of an example planarization process in accordance aspect of the present disclosure.
Figure 2B:
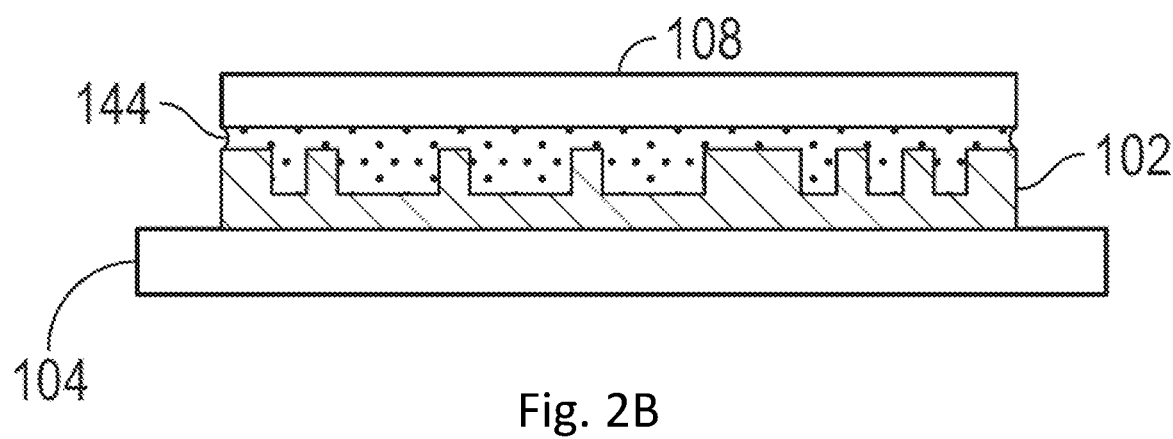
Figure 2C:
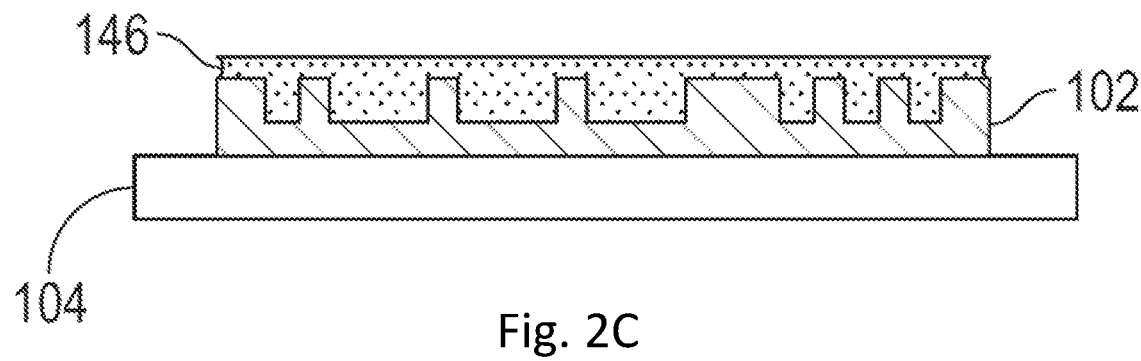

The planarization process includes steps which are shown schematically in FIGS. 2A-2C. As illustrated in FIG. 2A, the formable material 124 is dispensed in the form of droplets onto the substrate 102. As discussed previously, the substrate surface has some topography which may be known based on previous processing operations or may be measured using a profilometer, AFM, SEM, or an optical surface profiler based on optical interference effect like Zygo NewView 8200. The local volume density of the deposited formable material 124 is varied depending on the substrate topography. The superstrate 108 is then positioned in contact with the formable material 124. In the context of an imprint system, a template having a pattern is brought into contact with the deposited formable material 124.

FIG. 2B illustrates a post-contact step after the superstrate 108 has been brought into full contact with the formable material 124 but before a polymerization process starts. As the superstrate 108 contacts the formable material 124, the droplets merge to form a formable material film 144 that fills the space between the superstrate 108 and the substrate 102. Preferably, the filling process happens in a uniform manner without any air or gas bubbles being trapped between the superstrate 108 and the substrate 102 in order to minimize non-fill defects. The polymerization process or curing of the formable material 124 may be initiated with actinic radiation (e.g., UV radiation). For example, radiation source 126 of FIG. 1 can provide the actinic radiation causing formable material film 144 to cure, solidify, and/or cross-link, defining a cured planarized layer 146 on the substrate 102. Alternatively, curing of the formable material film 144 can also be initiated by using heat, pressure, chemical reaction, other types of radiation, or any combination of these. Once cured, planarized layer 146 is formed, the superstrate 108 can be separated therefrom. FIG. 2c illustrates the cured planarized layer 146 on the substrate 102 after separation of the superstrate 108. The substrate and the cured layer may then be subjected to additional known steps and processes for device (article) fabrication, including, for example, patterning, curing, oxidation, layer formation, deposition, doping, planarization, etching, formable material removal, dicing, bonding, and packaging, and the like. The substrate may be processed to produce a plurality of articles (devices).

An example superstrate chuck assembly 118 is shown in FIGS. 3A to 5F in accordance with a first example embodiment. A superstrate chuck assembly 518 in accordance with a second example embodiment is shown in FIG. 8.

Figure 3A:
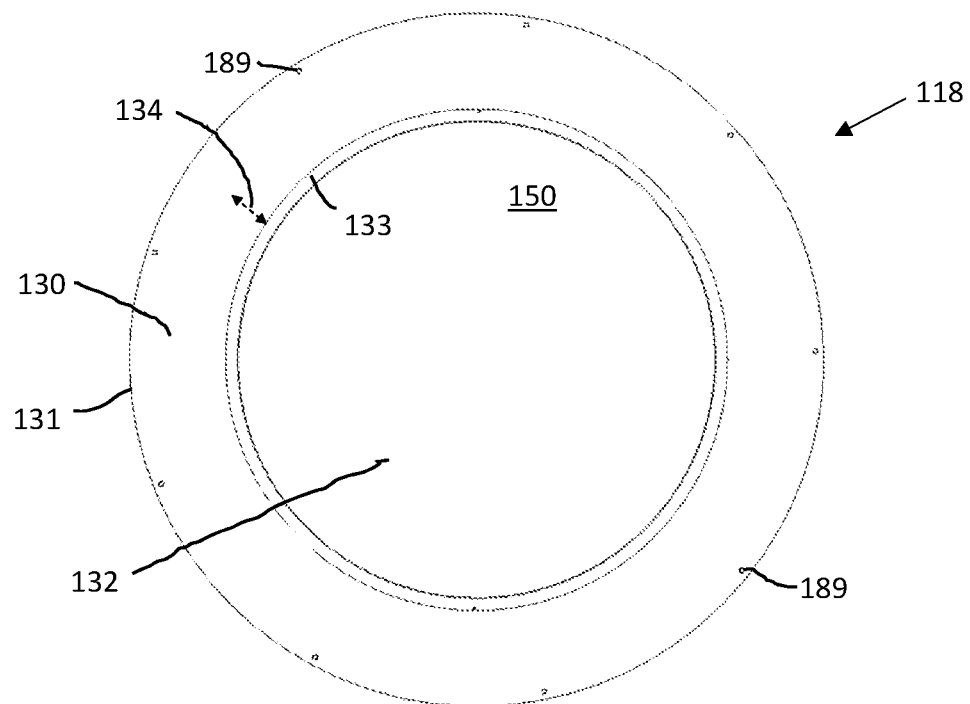
FIG. 3A shows a bottom view of an example plate chuck assembly is accordance with a first embodiment of the present disclosure.
Figure 3B:
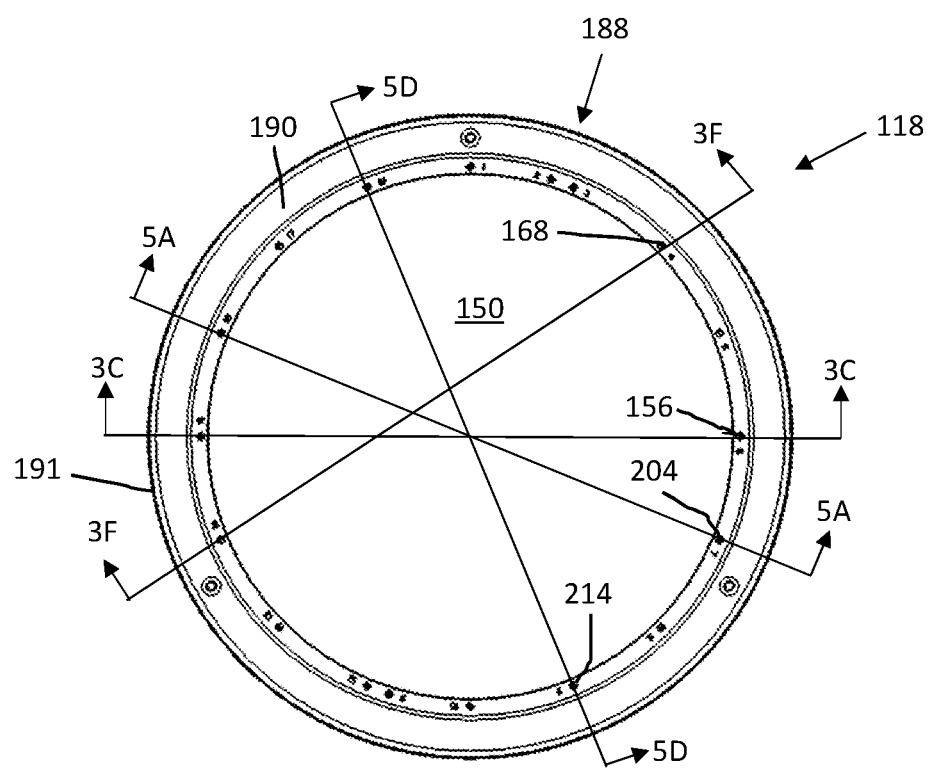
FIG. 3B shows a top view of the plate chuck assembly of FIG. 3A.
Figure 3C:
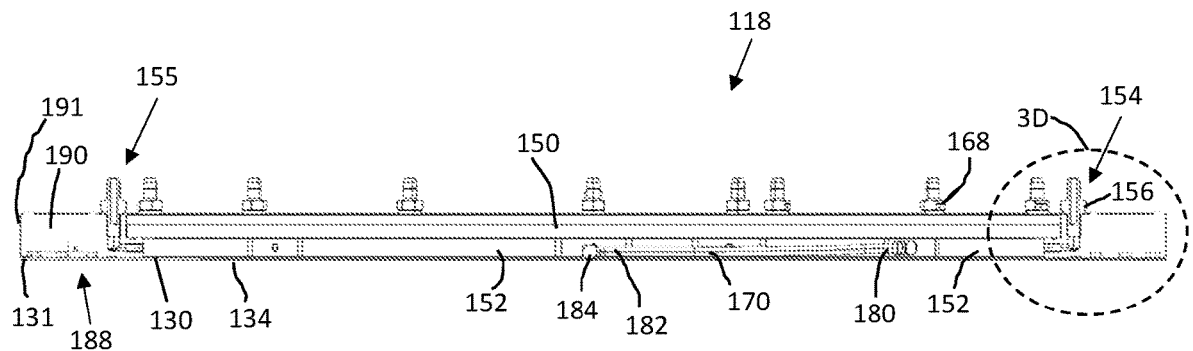
FIG. 3C shows a cross section taken along line 3C-3C of FIG. 3B.
Figure 3D:
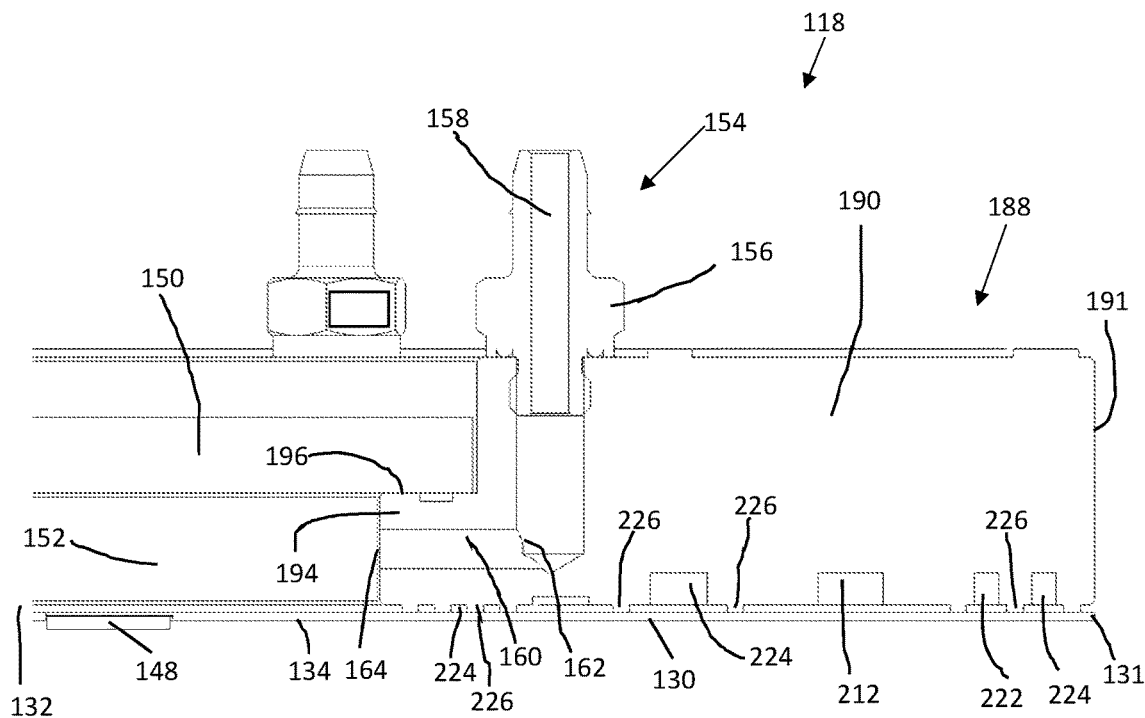
FIG. 3D shows an enlarged portion 3D of FIG. 3C.
Figure 3E:
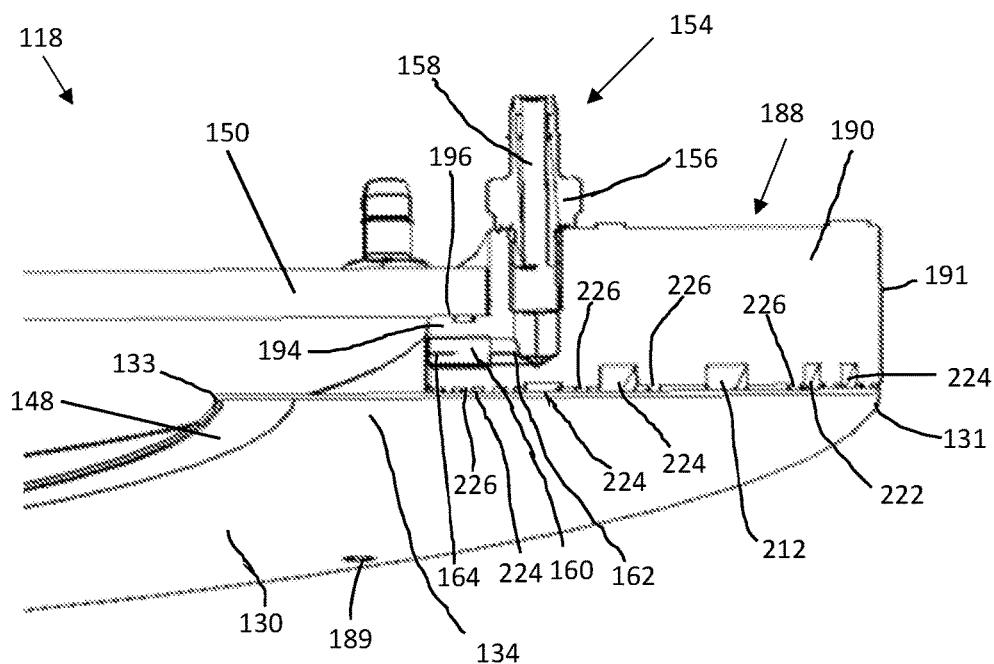
FIG. 3E shows a perspective view of the enlarged portion 3D of the FIG. 3C.

FIG. 3A shows a bottom view of the superstrate chuck assembly 118. FIG. 3B shows a top view of the superstrate chuck assembly 118. FIG. 3C shows a cross section taken along line 3C-3C of FIG. 3B. FIG. 3D shows an enlarged portion 3D of FIG. 3C. FIG. 3E shows a perspective view of the enlarged portion 3D of the FIG. 3C.

As shown in FIGS. 3A to 3E, the superstrate chuck assembly 118 may include a member 130 preferably having a ring shape. The member 130 may include a flexible portion 134. The size of the flexible portion 134 of the member 130 may be varied while performing the planarization process, as discussed below in more detail. The thickness of the member 130, including the flexible portion 134, may be from 0.2 to 5 mm or 0.3 to 2 mm in an example embodiment. The length of the flexible portion 134 at a point in the process when the flexible portion 134 is shortest (i.e., the state shown in FIGS. 7A to 7F discussed below) may be 10 mm to 200 mm or 20 to 75 mm in an example embodiment. The ratio of the length of the flexible portion to the thickness of the flexible portion may be 1000:1 to 2:1. In an embodiment, the ratio of the length of the flexible portion to the thickness of the flexible portion may be 5:1 to 200:1. A thicker material with a low elastic modulus will be similarly flexible as a thin material with high elastic modulus. The member 130 may be composed of a material having modulus of elasticity (Young's modulus) of 1 to 210 GPa, 50 to 150 GPa, or 60 to 100 GPa. In one example embodiment, the modulus of elasticity may be 70 GPa. The member 130 may be made of a transparent material that allows UV light to pass through or may not be made of a transparent material that allows for UV light to pass through. That is the member 130 may or may not be composed of an opaque material with respect to UV light. The member 130 may be composed of a plastic (e.g., acrylic), a glass (e.g., fused silica, borosilicate), metal (e.g., aluminum, stainless steel), or a ceramic (e.g., zirconia, sapphire, alumina). The member 130 may further have a flexural rigidity of 0.01 to 5 Pa·m³, 0.1 to 4 Pa·m³, 0.5 to 3 Pa·m³, 1.0 to 2 Pa·m³. Additionally, a ratio of the flexural rigidity of the member to the flexural rigidity of the superstrate may be 0.01:1 to 5:1, 0.05:1 to 4:1, 0.1:1 to 3:1, or 0.5:1 to 1:1, preferably less than 1:1. Equation (1) below defines the flexural rigidity D in which: H is the thickness of the superstrate 108 or the flexible portion 134 of the member 130; v is Poisson's ratio of the material of the superstrate 108 or the flexible portion 134 of the member 130; and E is Young's modulus of the material of the superstrate 108 or the flexible portion 134 of the member 130. For example, the flexural rigidity for the superstrate may be 2.12 while the flexural rigidity of the flexible portion 134 of the member 130 may be 0.29, 0.68, 0.82, or 2.30 Pa·m³. And the ratio of the flexural rigidity of the flexible portion 134 of the member 130 to the flexural rigidity of the superstrate 108 may be: 0.14:1; 0.32:1; 0.39:1; or 1.09:1.

$$D = \frac{EH^3}{12(1-v^2)} \quad (1)$$

The member 130 may further include a first cavity 148 (FIGS. 3D, 3E, 3I, 5C, 5F, 7A-73) configured to hold a portion of the superstrate 108 to the flexible portion 134 of the member 130. The first cavity 148 may be an annular cavity concentrically surrounding the central opening 132. The first cavity 148 may be located adjacent the inner edge 133 of the member. The first cavity 148 may be formed as a recessed portion in the flexible portion 134.

The superstrate chuck assembly 118 may further include a light-transmitting member 150 that covers the central opening 132 of the member 130. In one example embodiment, the light-transmitting member 150 is preferably transparent to UV light with high UV light transmissivity. That is, the material composition of the light-transmitting 150 member may be selected such that UV light used to cure the formable material passes through the light-transmitting member 150. In one example embodiment when the light-transmitting member 150 transmits UV light, the light-transmitting member may be composed of a material that transmits greater than 80% of light having a wavelength of 310-700 nm (i.e., UV light and visible light), e.g., sapphire, fused silica). In another example embodiment, the light-transmitting member need not be transparent with respect to UV light. When the light-transmitting member need not be transparent with respect to UV light, the light-transmitting member may be composed of a material that transmits greater than 80% of light having a wavelength of 400-700 nm (i.e., visible light), e.g., glass, borosilicate. That is, in the case when it is not necessary to transmit UV light, the light-transmitting member 150 should still transmit visible light.

As best seen in FIGS. 3C, 3D, and 3E the superstrate chuck assembly 118 may include a second cavity 152 defined by the member 130 and the light-transmitting member 150. More particularly, an underside surface of the light-transmitting member 150 and an upper surface of the member 130, being spaced apart, together define the second cavity 152. The second cavity 152 may be further defined by the inner side wall of the support ring 188. As also best seen in FIGS. 3C, 3D, 3E, the superstrate chuck assembly 118 may further include a fluid path 154 in communication with the second cavity 152 for pressurizing the second cavity 152. As used herein, pressurizing includes both positive pressure and negative pressure. The fluid path 154 can also be used to open the second cavity 152 to atmosphere. The fluid path 154 may include components that together allow the second cavity 152 to be selectively positively or negatively pressurized. In the illustrated example, the fluid path 154 includes a first port 156 connectable with a pressurizing source (not shown). The first port 156 may be connected to the pressurizing source via a tube (not shown), for example. The first port 156 includes a first passage 158 in communication with a second passage 160, where a first end 162 of the second passage 160 connects with the first passage 158 and a second end 164 of the second passage 160 connects to the second cavity 152. Thus, when the first port 156 is connected to the pressurizing source, positive pressure can be applied to pressurize the second cavity 152 via the first fluid path 154. One or more additional fluid paths may be implemented that have the same structure as the above-discussed fluid path 154. For example, as best seen in FIG. 3C, an additional fluid path 155 having the same structure as the fluid path 154 may be located at a position diametrically opposing the fluid path 154.

Figure 3F:
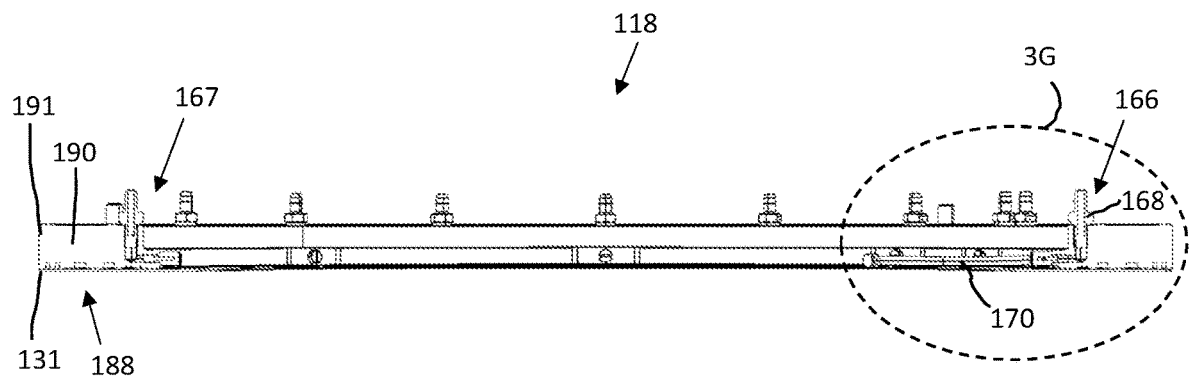
FIG. 3F shows a cross section taken along line 3F-3F of FIG. 3B.
Figure 3G:
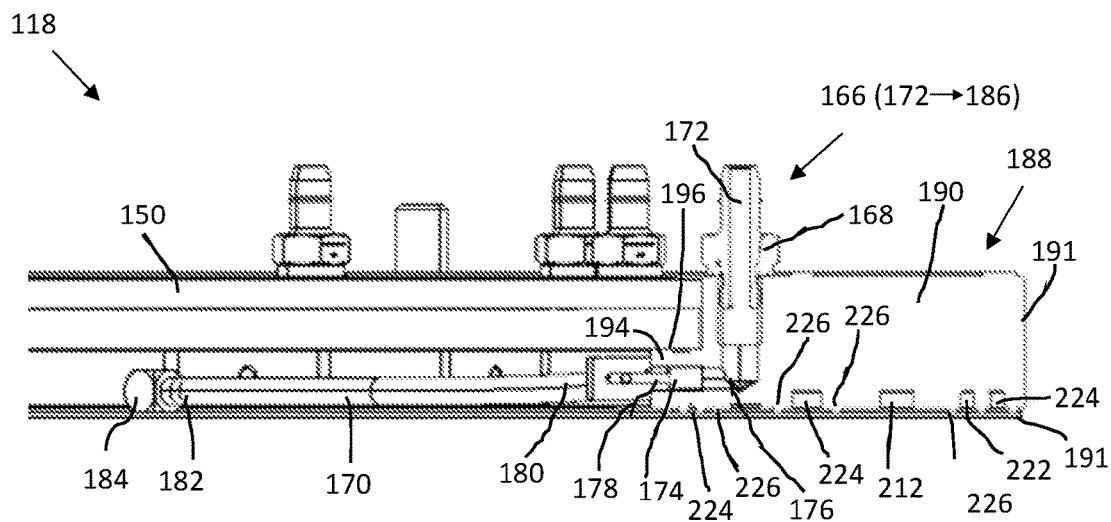
FIG. 3G shows an enlarged portion 3G of FIG. 3F.
Figure 3H:
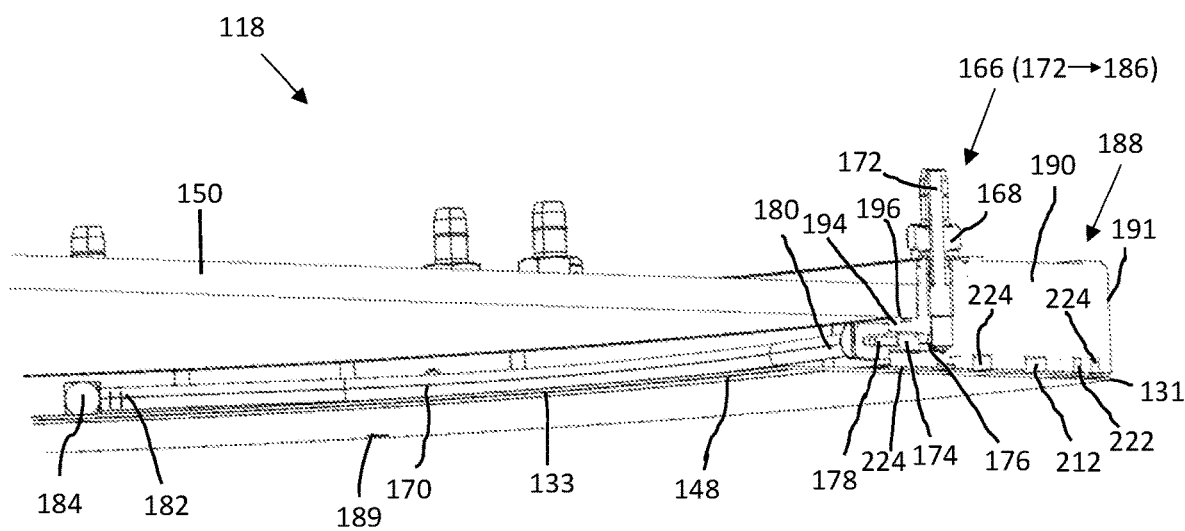
FIG. 3H shows a side perspective view of the enlarged portion 3G of FIG. 3F.
Figure 3I:
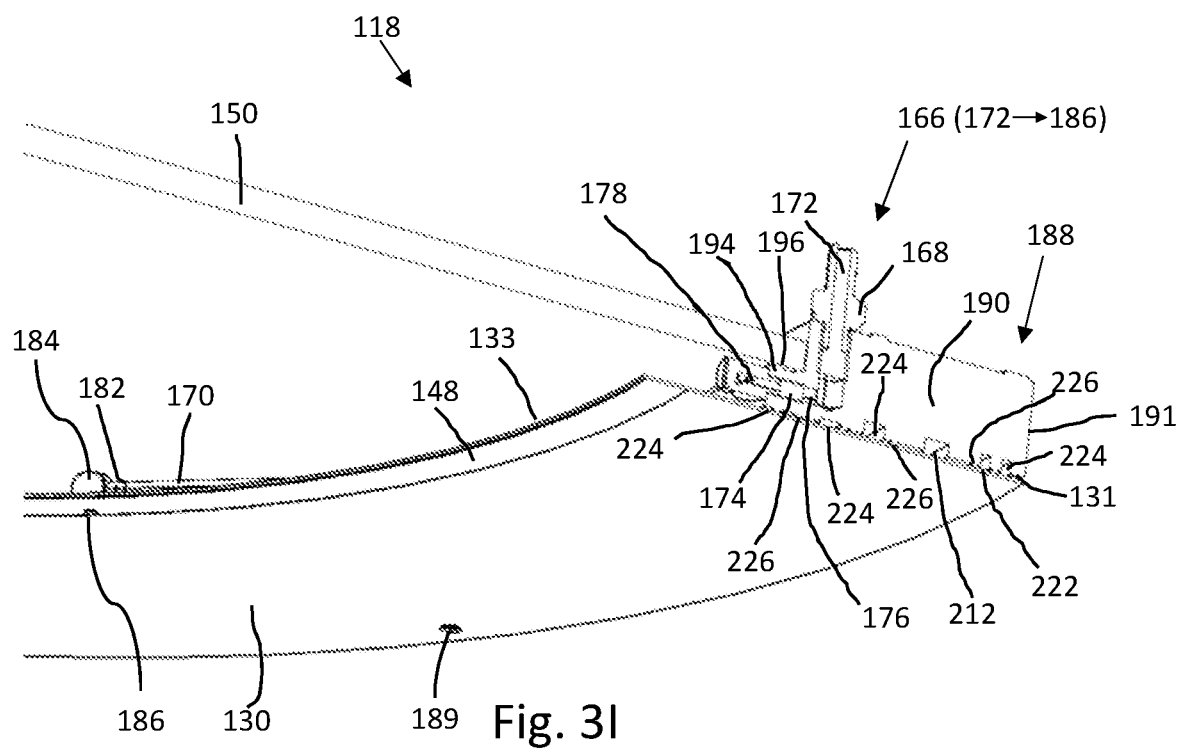
FIG. 3I shows an underside perspective view of the enlarged portion 3G of FIG. 3F.

The superstrate may be held by the flexible portion 134 by reducing pressure in the first cavity 148. One manner of reducing pressure in the first cavity 148 is providing a vacuum to the first cavity. In order to also provide a vacuum to the first cavity 148 of the member 130, the superstrate chuck assembly 118 may further include a path 166 (also referred herein as a vacuum path) in communication with the first cavity 148. In a case that there is already a pressure differential within the assembly relative to the atmosphere around the assembly, the path 166 can be used as a manner of reducing pressure in the first cavity without being coupled to a vacuum. The vacuum path 166 is best shown in FIGS. 3G, 3H, and 3I. As described in more detail below, the vacuum path 166 may start with a first passage 172 and end with a through hole 186. FIG. 3F shows a cross section taken along line 3F-3F of FIG. 3B. FIG. 3G shows an enlarged portion 3G of FIG. 3F. FIG. 3H shows a side perspective view of the enlarged portion 3G of FIG. 3F. FIG. 3I shows an underside perspective view of the enlarged portion 3G of FIG. 3F. The vacuum path 166 may include components that together allow the first cavity 148 to impart a vacuum onto the superstrate 108. In the illustrated example embodiment, the vacuum path 166 includes a second port 168 connectable with a vacuum source (not shown) and a routing tube 170 connecting the second port 168 to the first cavity 148. The second port 168 may be connected to the vacuum source via a tube (not shown), for example. The second port 168 includes a first passage 172 in communication with a second passage 174, where a first end 176 of the second passage 174 connects with the first passage 172 and a second end 178 of the second passage 174 connects to the routing tube 170. The routing tube 170 may be a flexible tube having a first end 180 connected to the second end of the 178 of the second passage 174 of the second port 168 and having a second end 182 connected to a fitting 184, e.g., a pneumatic fitting. The fitting 184 is also connected to a through hole 186 formed through the flexible portion 134 of the member 130 and leading into the first cavity 148. That is, by being connected to both the routing tube 170 and the through hole 186, the fitting 184 directs the vacuum suction downwardly into the first cavity 148 via the through hole 186. Thus, when the second port 168 is connected to the vacuum source, a vacuum can be applied to first cavity 148 in order to provide a suction force capable of coupling the area of the superstrate 108 under the first cavity 148 with the flexible portion 134.

One or more additional vacuum paths may be implemented that have the same structure as the above-discussed vacuum path 166, where each vacuum path is in communication with the same first cavity 148 and/or communication with a corresponding additional first cavity (not shown) formed in the member 130. The additional first cavity or cavities may be disposed concentrically around the first cavity 148. That is, the additional first cavity or cavities may also be concentrically disposed around the central opening 132, but may be located at a greater radial distance from the inner edge 133 than the illustrated first cavity 148. In an embodiment, the inner diameter of the member 130 may be smaller and/or the first cavity 148 may have additional lands. For example, as best seen in FIG. 3F, an additional vacuum path 167 having the same structure as the vacuum path 166 may be located at a position diametrically opposing the vacuum path 166. The additional first cavity or vacuum cavities may be used to assist in separating the superstrate from a cured layer as part of the planarization process discussed below in more detail. In another aspect, the additional cavity or vacuum cavities allow the same superstrate chuck assembly 118 to be used with different sized superstrates.

In another embodiment, it is possible that the first cavity 148 and vacuum path 166 may be replaced with another mechanism for coupling the member 130 with a superstrate. For example, in place of a cavity/vacuum arrangement, an electrode that applies an electrostatic force may be included. Another option is mechanical latching where a mechanical structure on the underside of the member 130 is mateable (capable of making a good, close, and/or proper fit) with the superstrate.

The superstrate chuck assembly 118 may further include a support ring 188. The support ring 188 need not be made of a transparent material that allows for UV light to pass through. That is the support ring 188 may be composed of an opaque material with respect to UV light. The support ring 188 may be composed of plastic (e.g., acrylic), glass (e.g., fused silica, borosilicate), metal (e.g., aluminum, stainless steel), or ceramic (e.g., zirconia, sapphire, alumina). In an example embodiment, the support ring 188 may be composed of the same material as the member 130.

Figure 4:
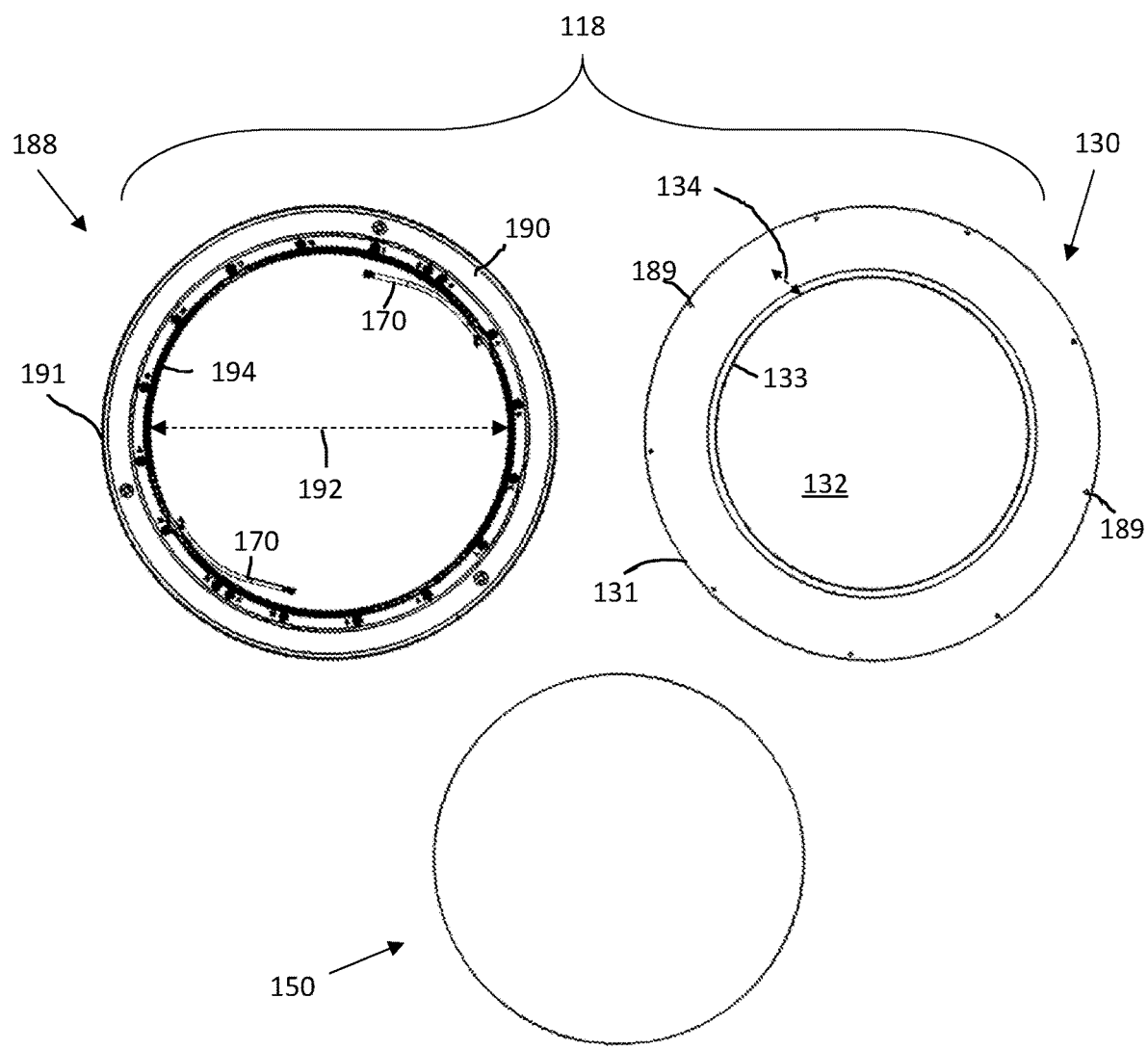
FIG. 4 shows an exploded view of the plate chuck assembly of FIGS. 3A to 3F.

FIG. 4 shows an exploded view where the support ring 188 is shown separated from the member 130 and the light transmitting member 150. As best seen in FIG. 4, the support ring 188 may generally include a circular main body 190 defining an open central area 192. The outer circumference of the support ring 188 may be uniform. The inner circumference of the support ring 188 may include a step 194 that provides a receiving surface 196 for receiving the light transmitting member 150. That is, as best seen in FIGS. 3D, 3E, 3G, 3H, 3I the light transmitting member 150 may be placed onto the receiving surface 196 of the step 194, thereby covering the central area 192. The light transmitting member 150 may be secured onto the receiving surface 196, such as with an adhesive. In this manner, when the light transmitting member 150 is placed/secured onto the receiving surface 196, the second cavity 152 is defined by the underside surface of the light transmitting member, the inner surface of support ring 188 (more particularly, the inner surface of the step 194), and the upper surface of the member 130.

The member 130 may be coupled to the underside surface of the support ring 188 using a coupling member (not shown) such as a screw, nut/bolt, adhesive, and the like. The coupling member may preferably be located adjacent the outer edge 191 of the support ring 188 and adjacent the outer edge 131 of the member 130. When the coupling member is a screw, the coupling member preferably passes through the member 130 adjacent the outer edge 131 and into the support ring 188 adjacent the outer edge 191, such as through a plurality of receiving holes 189 (FIG. 3E, 3H, 3I, 4, 5C, 5F).

When the coupling member is an adhesive, the coupling member is preferably located between the member 130 adjacent the outer edge 131 and the support ring 188 adjacent the outer edge 191. In this manner, an upper surface of the member 130 contacts and is fixed to the underside surface of the circular main body 190 of the support ring 188 adjacent the outer edge 131 and the outer edge 191. Additional surface area of member 130 may be selectively coupled to the support ring 188 as part of the planarization process. The manner of selectively coupling the additional surface area of the member 130 to the support ring 188 is discussed in more detail below.

As shown in FIGS. 3C, 3D, and 3E, all or a portion of the fluid path 154 and/or additional fluid path 155 discussed above may be contained within the support ring 188, and all or a portion as shown in FIGS. 3F, 3G, 3H, and 3I of the vacuum path 166 and/or additional vacuum path may be contained within the support ring 188. More particularly, a portion of the first port 156, a portion of the first passage 158, the second passage 160, the first end 162, and the second end 164 of the fluid path 154 may be contained within the support ring 188, while a portion of the second port 168, a portion of the first passage 172, the second passage 174, the first end 176, and the second end 178 of the vacuum path 166 may be contained within the support ring 188. However, as best shown in FIGS. 3G and 3H, the routing tube 170 may be external to the support ring 188. Thus, the support ring 188, in addition supporting the light transmitting member 150 and the member 130, may also provide the pathway/structure for the fluid paths and vacuum paths. In an alternative embodiment, there is no routing tube 170 and the vacuum passes through a port in the support ring 188 via a channel from the inflexible portion 135 of the member 130 to the flexible portion 134 of the member 130 to the first cavity 148.

Figure 5A:
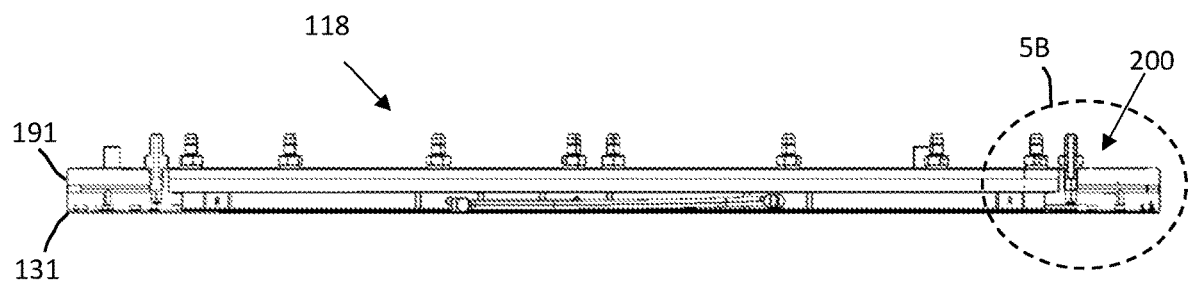
FIG. 5A shows a cross section taken along line 5A-5A of FIG. 3B.
Figure 5B:
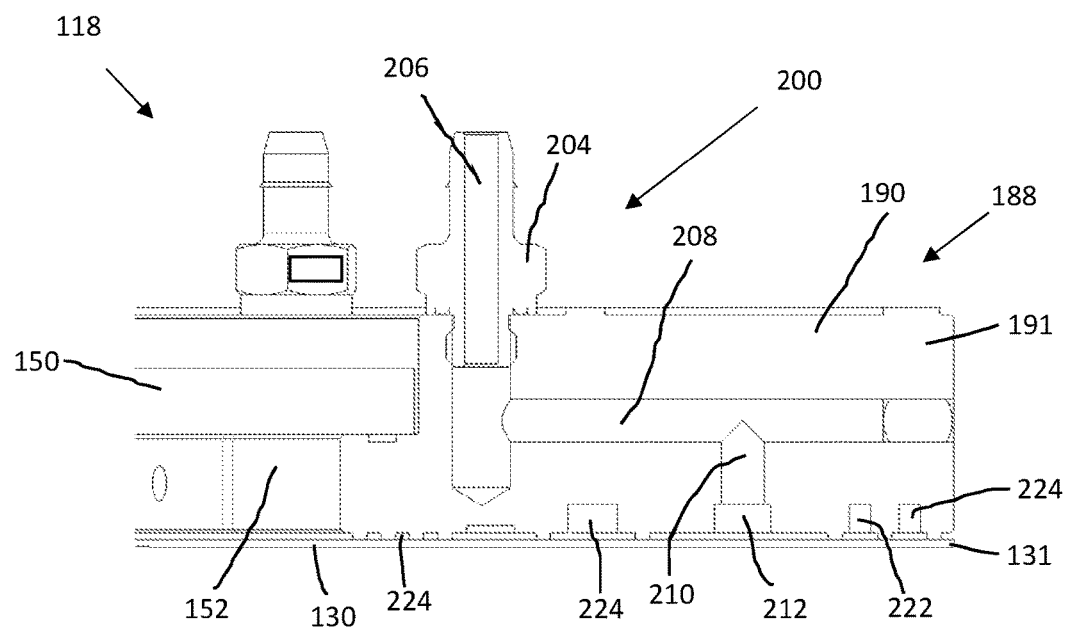
FIG. 5B shows an enlarged portion 5B of FIG. 5A.
Figure 5C:
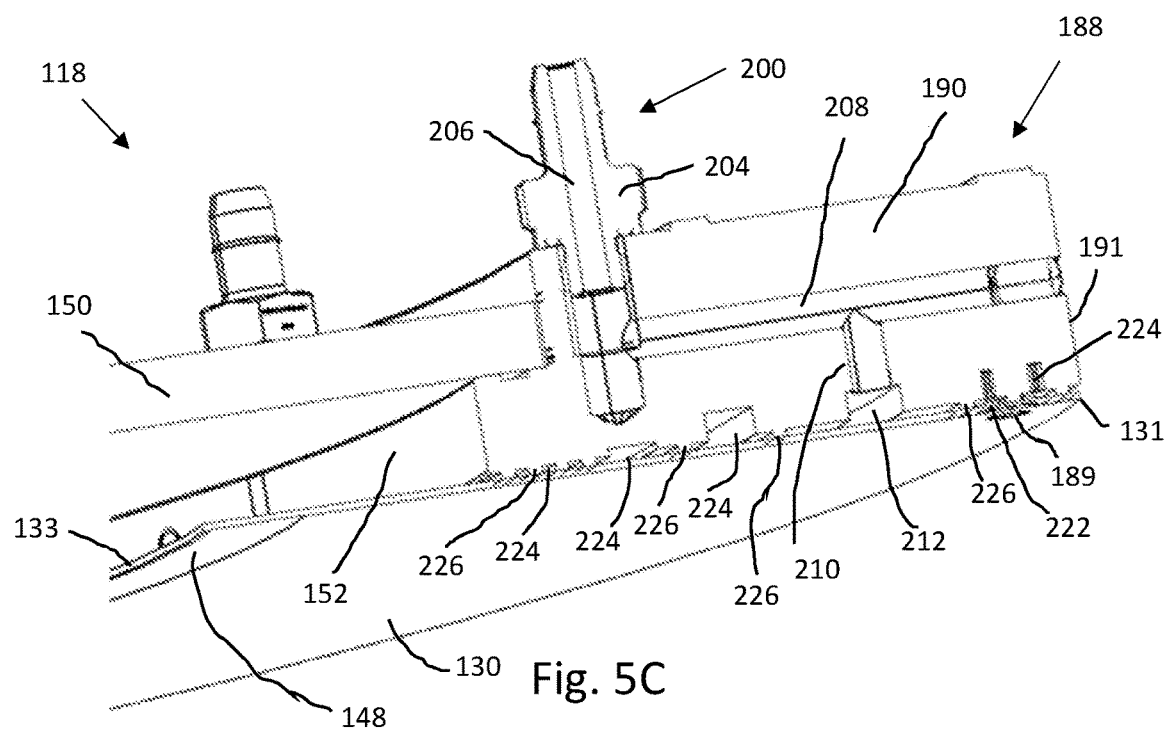
FIG. 5C shows a side perspective view of the enlarged portion 5B of FIG. 5A.
Figure 5D:
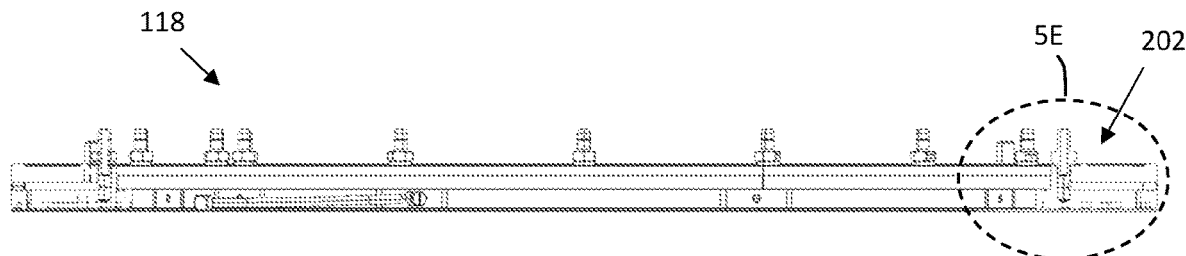
FIG. 5D shows a cross section taken along line 5D-5D of FIG. 3B.
Figure 5E:
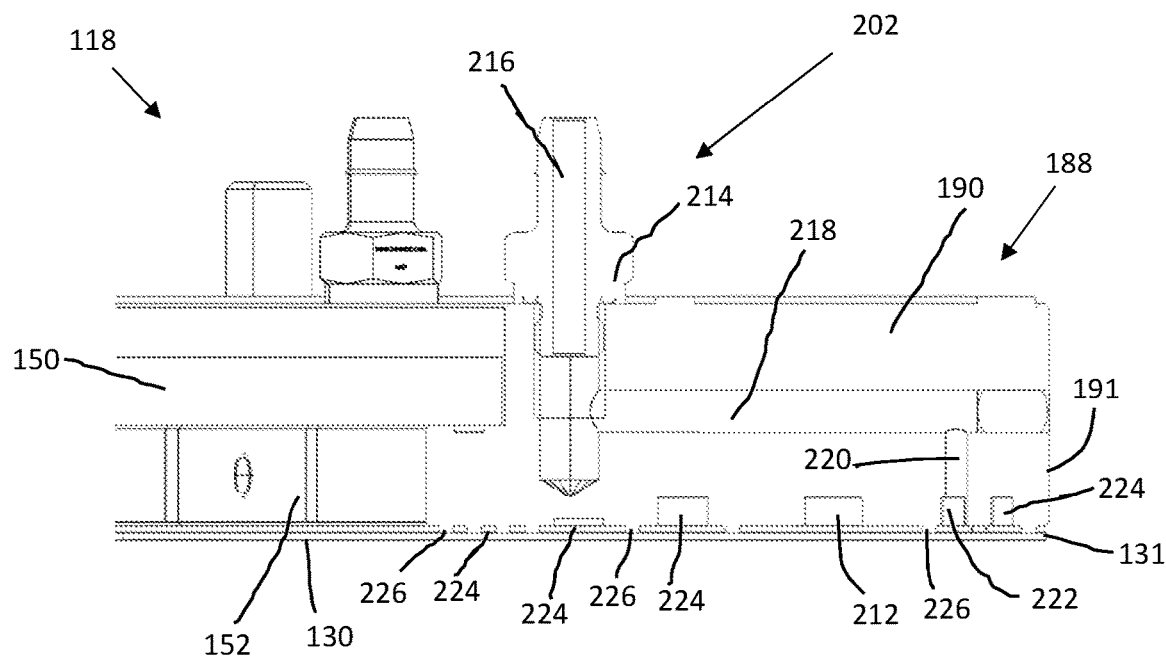
FIG. 5E shows an enlarged portion 5E of FIG. 5D.
Figure 5F:
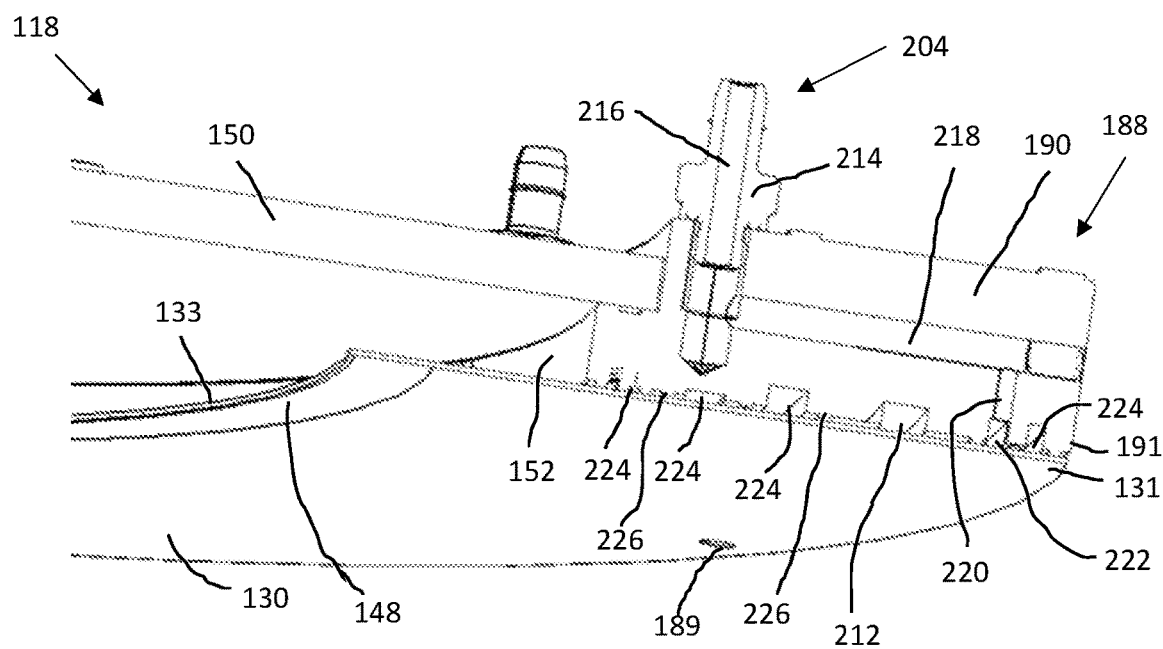
FIG. 5F shows a side perspective view of the enlarged portion 5E of FIG. 5D.

The superstrate chuck assembly 118 may further include additional vacuum paths that allow the member 130 to be selectively secured to the underside surface of the support ring 188. While the above-described vacuum flow paths communicate with the first cavity 148 of the member 130, the additional vacuum paths that allow the member 130 to be selectively secured to the underside surface of the support ring 188 are annular cavities in the support ring 188 that are open on the underside surface of the support ring 188. FIGS. 5A to 5C show an example of a first vacuum path 200 used for selectively securing the member 130 to the support ring 188. FIGS. 5D to 5F show an example of a second vacuum path 202 used for selectively securing the member 130 to the support ring 188.

FIG. 5A shows a cross section taken along line 5A-5A of FIG. 3B. FIG. 5B shows an enlarged portion 5B of FIG. 5A. FIG. 5C shows a side perspective view of the enlarged portion 5B of FIG. 5A. The first vacuum path 200 may include components that together impart a vacuum suction force onto the upper surface of the member 130 to further secure the member 130 to the underside surface of the support ring 188. In the illustrated example embodiment, the first vacuum path 200 includes a first port 204 connectable with a vacuum source (not shown). The first port 204 of the vacuum path 200 may be connected to the vacuum source via a tube (not shown), for example. As best seen in FIGS. 5B and 5C, the first port 204 of the vacuum path 200 includes a first passage 206 connected with a second passage 208, and the second passage 208 is connected with a third cavity 210. As also best seen in FIGS. 5B and 5C, the first passage 206 may be oriented vertically to direct the vacuum downwardly, the second passage 208 of the vacuum path 200 may be oriented horizontally to direct the vacuum radially, and the third cavity 210 of the vacuum path 200 may be oriented vertically to direct the vacuum downwardly. The third cavity 210 of the vacuum path 200 may be connected a first annular cavity 212 having an open end facing downwardly toward the member 130. Thus, when the first port 204 of the vacuum path 200 is connected to the vacuum source, and the upper side surface of the member 130 is in contact with the underside surface of the support ring 188, a vacuum can be applied to the first annular cavity 212 of the vacuum path 200 to secure the member 130 to the support ring 188, via the first vacuum path 200.

FIG. 5D shows a cross section taken along line 5D-5D of FIG. 3B. FIG. 5E shows an enlarged portion 5E of FIG. 5D. FIG. 5F shows a side perspective view of the enlarged portion 5E of FIG. 5D. The second vacuum path 202 may include components that together impart a vacuum suction force onto the upper surface of the member 130 to secure the member 130 to the underside surface of the support ring 188. In the illustrated example embodiment, the second vacuum path 202 includes a second port 214 connectable with a vacuum source (not shown). The second port 214 of second vacuum path 202 may be connected to the vacuum source via a tube (not shown), for example. As best seen in FIGS. 5E and 5F, the second port 214 of second vacuum path 202 includes a first passage 216 connected with a second passage 218, and the second passage 218 is connected with a third cavity 220. As also best seen in FIGS. 5E and 5F, the first passage 216 of second vacuum path 202 may be oriented vertically to direct the vacuum downwardly, the second passage 218 of second vacuum path 202 may be oriented horizontally to direct the vacuum radially, and the third cavity 220 of second vacuum path 202 may be oriented vertically to direct the vacuum downwardly. The third cavity 220 of second vacuum path 202 may be connected a second annular cavity 222 having an open end facing downwardly toward the member 130. Thus, when the second port 214 of second vacuum path 202 of the vacuum path 202 is connected to the vacuum source, and the upper side surface of the member 130 is in contact with the underside surface of the support ring 188, a vacuum can be applied to the first annular cavity 212 of second vacuum path 202 to secure the member 130 to the support ring 188, via the second vacuum path 202.

As best seen by comparing FIGS. 5B and 5C with FIGS. 5E and 5F, the first annular cavity 212 is located radially inwardly relative to the second annular cavity 222. That is, the first annular cavity 212 is closer to the second cavity 152 than the second annular cavity 222 in a radial direction. Because the first annular cavity 212 and the second annular cavity 222 are different radial locations, each cavity will apply a suction force to a different annular section of the upper side surface of the member 130. Furthermore, because each of the first annular cavity 212 and the second annular cavity 222 are in communication with a vacuum source via distinct flow paths (i.e., the first annular cavity 212 is part of the first flow path 200 and the second annular cavity 222 is part of the second flow path 202), the vacuum can be independently applied to each cavity. For example, if a vacuum is applied only to the second annular cavity 212, then the suction force will only be imparted on the portion of upper side surface of the member 130 that contacts the second annular cavity 212. However, if vacuum is applied to both the first annular cavity 212 and the second annular cavity 222 at the same time, then suction force will be imparted on a wider area of the upper side surface of the member 130, i.e., the portion of the upper side surface of the member 130 that contacts the first annular cavity 212 and the portion of the upper side surface of the member 130 that contact the second annular cavity 222.

As shown in FIGS. 3C to 3I and 5A to 5F, the support ring 188 may include additional annular cavities 224 that may impart a vacuum suction onto the member 130 in the same manner as discussed above. That is, each of the additional annular cavities 224 may be in communication with a vacuum source via a port and connecting cavities. The additional annular cavities 224 may be spaced apart in a radial direction. The number of additional annular cavities 224 may be chosen to provide the optimal control over how much surface area of the member 130 is suctioned underneath the support ring 188. For example, the number of annular cavities may be from 1 to 10, from 3 to 7, or from 4 to 6. As seen in the figures, the annular cavities may be of varying size. The ratio of the cross sectional area of one of the annular cavities to the cross sectional area of another one of the annual cavities may be from 10:1 to 1:1, from 8:1 to 4:1, or from 5:1 to 3:1. Some of the annular cavities may have the same size and shape. The annular cavities may have a cross section shape that is rectangular or square. The support ring 188 may further include lands 226 between adjacent annular cavities. The lands 226 are the portion of the support ring that comes into contact with the upper surface of the member 130.

Figure 6:
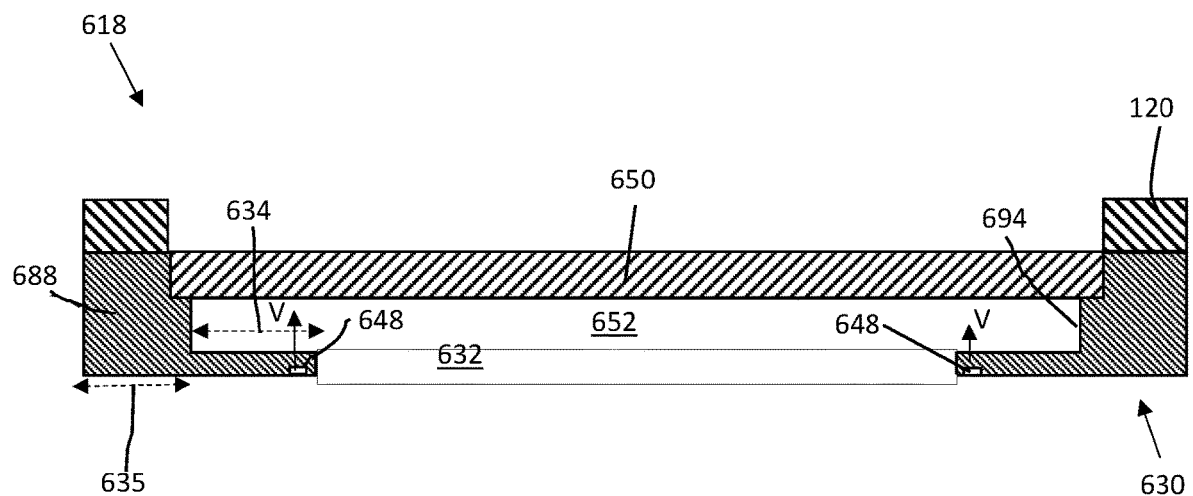
FIG. 6 shows a schematic representation of an example plate chuck assembly is accordance with a second embodiment of the present disclosure.

While the example embodiment of the superstrate chuck assembly 118 includes the support ring 188 as a separate structural element from the member 130, in another example embodiment, the member may be a single structural piece including a portion shaped like the member and a portion shaped like the support ring. In other words, in such an embodiment, there is no separate support ring and instead there is a single continuous structure having a thick portion resembling the support ring and thin portion resembling the flexible portion of the support ring. Because there is not a separate support ring and member in such an embodiment, there is also no need for any of the annular cavities or a need for any of the ports and cavities that provide a vacuum path. Rather, only the fluid path(s) and possibly vacuum path(s) leading to the second cavity (i.e., an equivalent to fluid path 154) and possibly the vacuum path(s) leading to the flexible portion of the member (i.e., an equivalent to vacuum path 166) would be present in this embodiment. FIG. 6 shows a schematic cross section of such another example embodiment of a superstrate chuck assembly 618.

As shown in FIG. 6, in the additional example embodiment, the superstrate chuck assembly 618 may be similar to the superstrate chuck assembly 118, except that the instead of a member coupled with a support ring, the superstrate chuck assembly 618 includes a single member 630 having both the structure of the support ring of the first example superstrate chuck assembly 118 and some of the structure found in the support ring 188 of the first example superstrate chuck assembly 118. That is, the member 630 may similarly preferably have a ring shape and include a central opening 632, a flexible portion 634, and a first cavity 648 configured to hold the superstrate 108 to the flexible portion 634. The superstrate chuck assembly 618 may similarly further include a light-transmitting member 650 that covers the central opening 632, where the light-transmitting member 650 is the same as the light-transmitting member 150 of the first example embodiment. The superstrate chuck assembly 618 may similarly include a second cavity 652 and a fluid path (not shown) in communication with the second cavity 652 for pressurizing the second cavity 652. The fluid path 654 may be the same as the fluid path 154 of the first example embodiment. The superstrate chuck assembly 618 may further include a vacuum path (not shown) in communication with the first cavity 648 that is the same as in the first example embodiment.

Instead of a separate support ring, the member 630 may further include a support portion 688. The support portion 688 may have essentially the same structure as support ring 188 of the first example embodiment, except that there are no annular cavities because the support portion is part of the member 630 rather than a separate coupled piece. As with the first embodiment, the support portion 688 may include a circular main body defining an open central area, where the inner circumference of the support portion 688 includes a step 694 that provides a receiving surface for receiving the light transmitting member 650.

Similar to the first example embodiment, the member 630 may include an inflexible portion 635 and a flexible portion 634. However, in the superstrate chuck assembly 618, the length of the inflexible portion 635 is fixed because it is defined by the support portion 688, the support portion 688 being an integrated part of the member 630. For the same reason, the flexible portion 634 is fixed. That is, the thicker support portion 688 of the member 630 is inflexible, while the thinner flexible portion 634 is flexible. Thus, the superstrate chuck assembly 618 is similar to the check assembly 118 of the first example embodiment, except for the ability to change the length of the flexible and inflexible portions of the member as part of the planarization method. Furthermore, because the member 630 includes the support portion 688, in the superstrate chuck assembly 618, the second cavity 652 is defined specifically by the flexible portion 634. The material of the member 630 may be the same material as the member 130 or the support ring 188 described above, including the same modulus of elasticity. The thickness of the flexible portion 634 of the member 630 may be the same as the thickness of the member 130 detailed above with respect to the previous embodiment. The length of the flexible portion 634 of the member 630 may be the same as the length of the flexible portion 134 at the point in time when the flexible portion 134 is shortest, as detailed above with respect to the previous embodiment. The ratio of the length of the flexible portion 634 of the member 630 may be the same as the length to thickness ratio of the member 130 detailed above with respect to the previous embodiment.

Figure 7A:
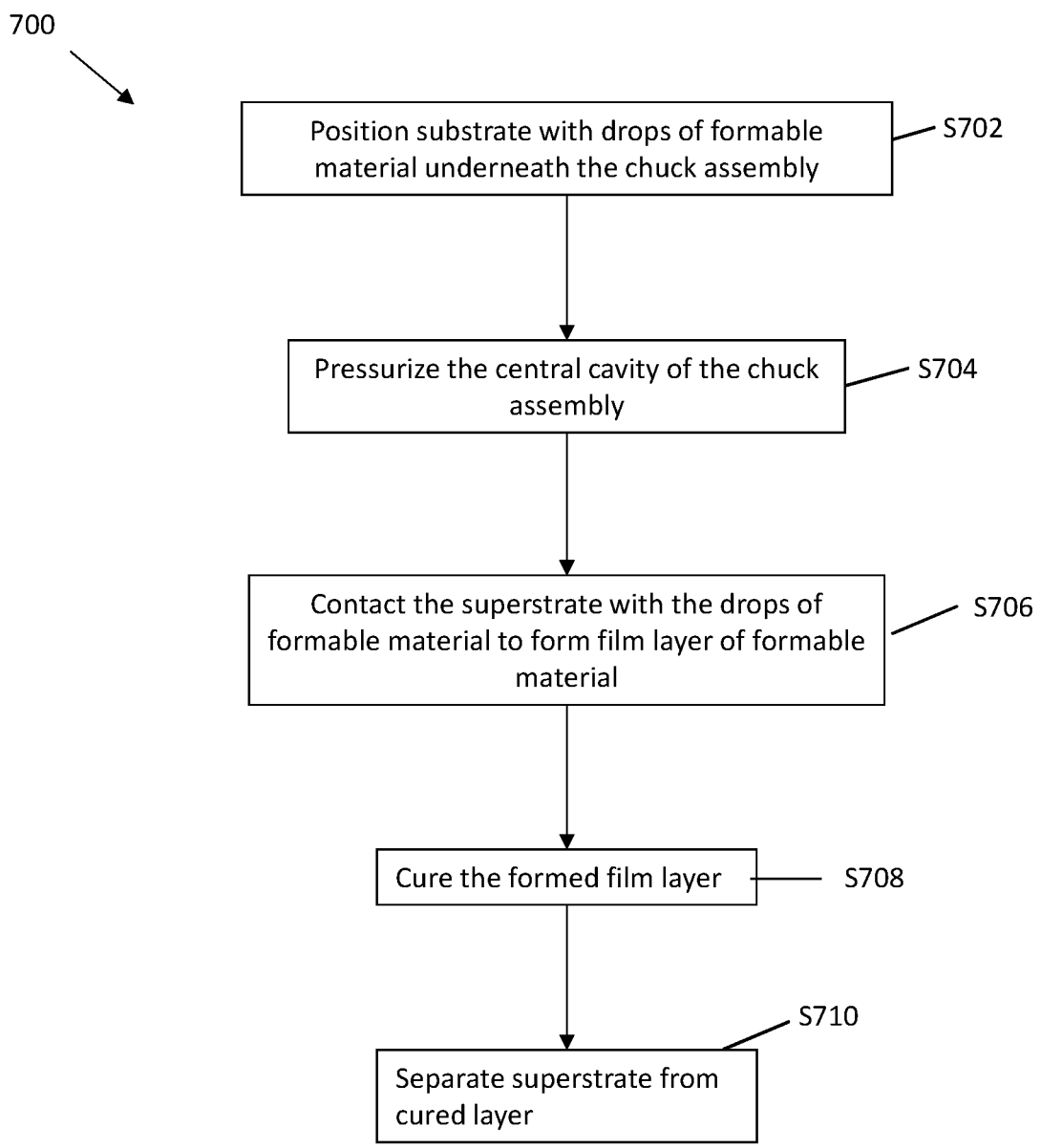
FIG. 7A shows a flow chart of an example planarization method in accordance with aspect of the present disclosure.
Figure 7B:
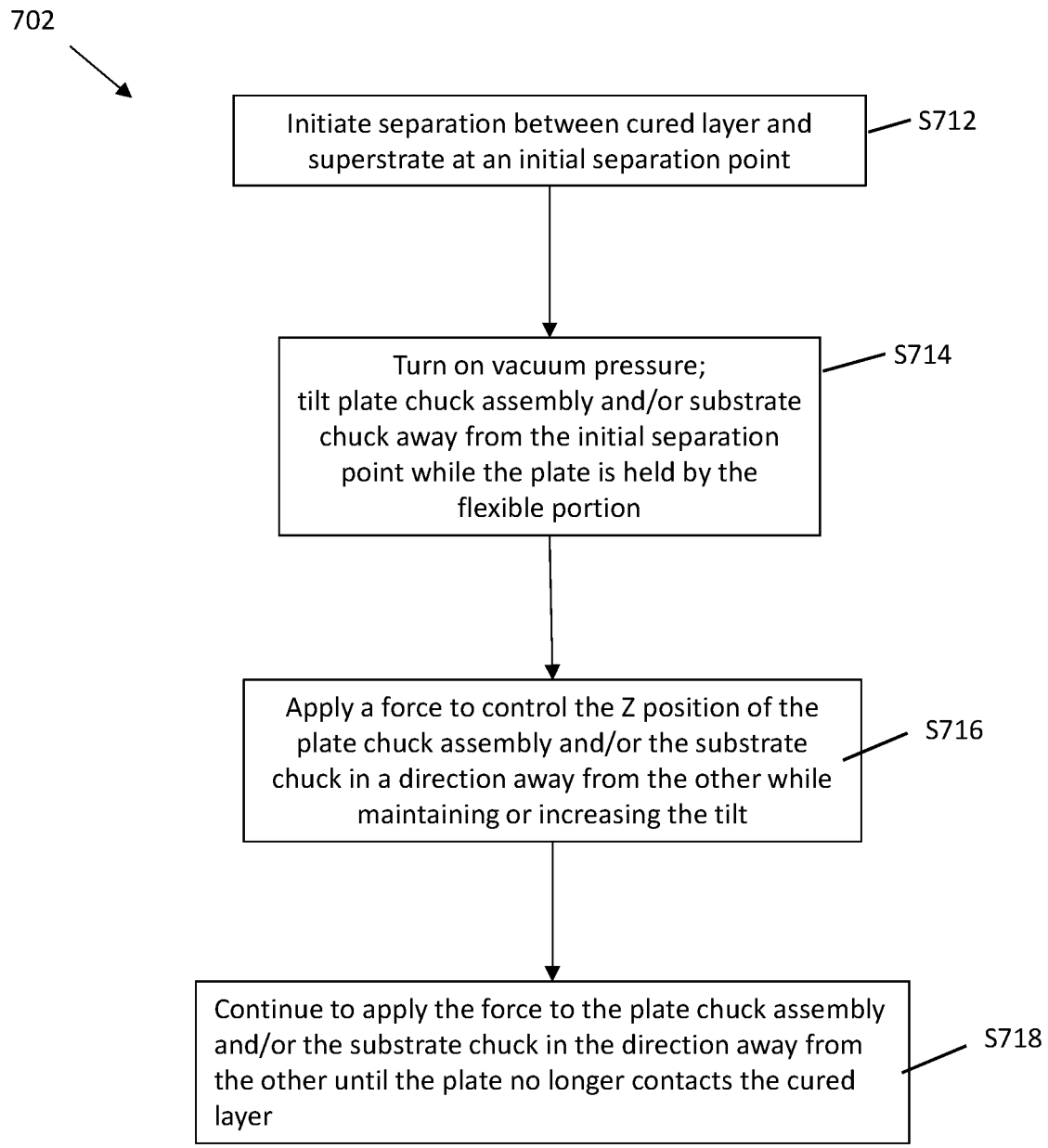
FIG. 7B shows a flow chart of an example method of separating a superstrate from a cured layer.
Figure 8A:
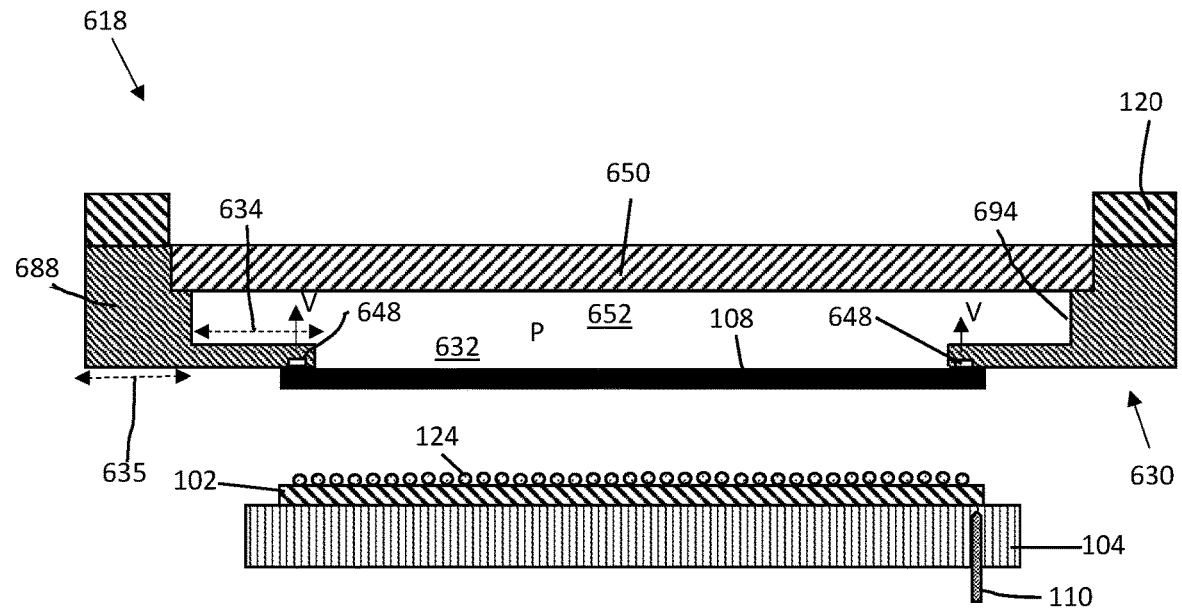
FIGS. 8A to 8R show a series of schematic cross sections of the planarization method of FIG. 7A including the method of separating of FIG. 7B, in accordance with an example embodiment.
Figure 8B:
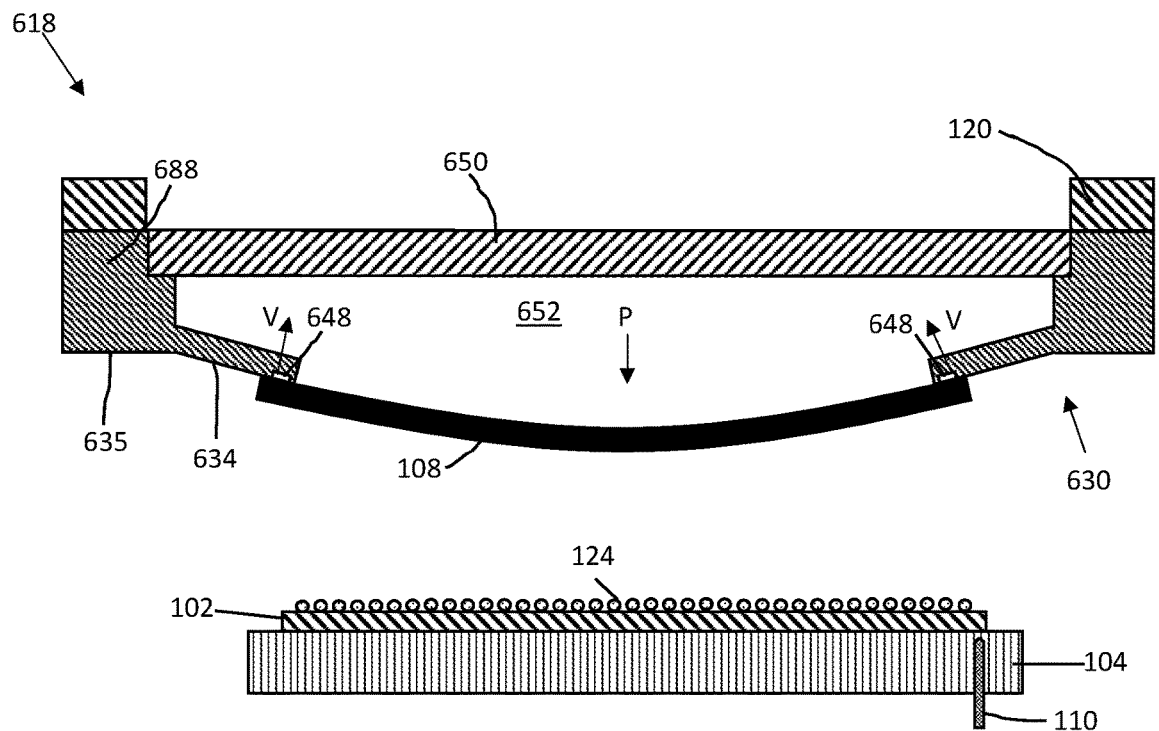
Figure 8C:
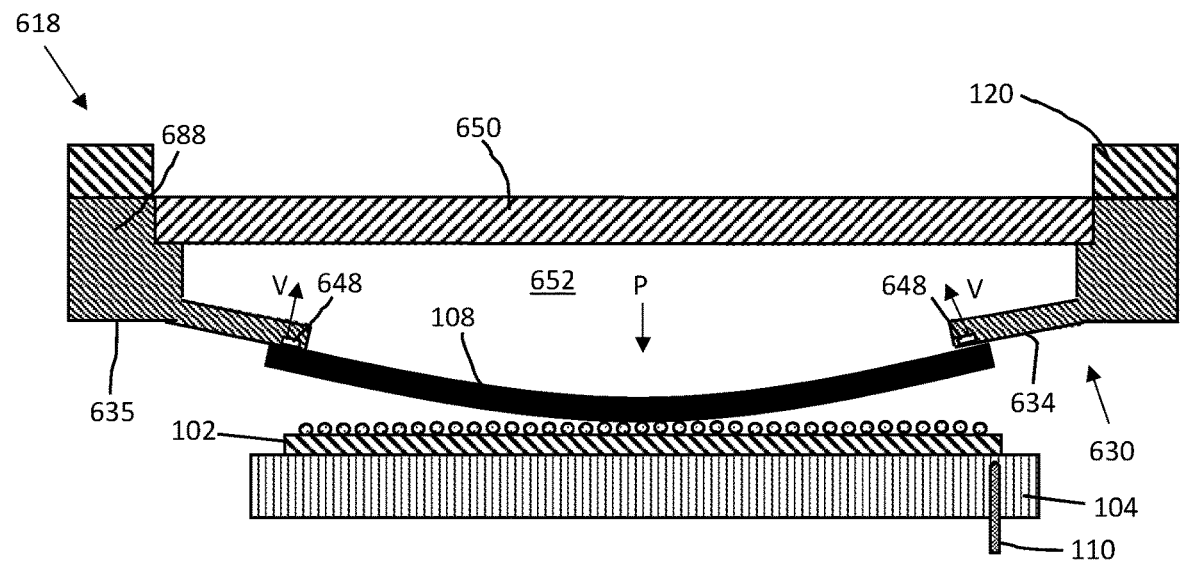

Operation of the superstrate chuck assembly 618 as part of the forming process will now be described with reference to FIGS. 7A to 12C. FIG. 7A shows a flow chart of a planarization method 700, which is one example of the forming process. FIG. 7B shows a flow chart of a method of separating 702, which includes more details of the separation step S710. The forming process may alternatively be an imprint method in which a template having a pattern is used in place of the superstrate. FIGS. 8A to 8R show cross sectional schematic views of the planarization method 700 and separation method 702 using the superstrate chuck assembly 618 of the second example embodiment. While the superstrate chuck assembly 618 is shown in the example method, the method may also be performed using the superstrate chuck assembly 118 of the first example embodiment.

The method begins at step S702, where the substrate 102 having drops of formable material 124 dispensed thereon, is brought underneath the superstrate 108 that is coupled with the member 630 of the superstrate chuck assembly 618. Thus, prior to performing step S702, the drops of formable material are dispensed onto the substrate in the manner described above. This moment is shown in FIG. 8A. FIG. 8A shows a schematic cross section of the substrate 102 having dispensed formable material 124 positioned below the superstrate 108 being held by the superstrate chuck assembly 618.

Prior to performing step S702, the superstrate chuck assembly 618 is prepared by applying the vacuum suction to the first cavity 648 of the member 630 and contacting the first cavity 648 to the upper side surface of the superstrate 108, thereby coupling the superstrate 108 to the member 630. In a case where there are multiple vacuum cavities (e.g., 2) in the flexible portion 634 of the member 630, in one embodiment, less than all (e.g., only one) of the vacuum cavities will have a vacuum implemented during step S702. For example, in one embodiment, only the radially outermost first cavity relative to the central opening 632 may have a vacuum imparted. However, in another embodiment, all of the vacuum cavities (e.g., 2) may have a vacuum implemented during step S702.

As shown in FIG. 8A, at the time that the substrate 102 is placed underneath the superstrate 108, the second cavity 652 may not yet be pressurized with positive pressure in one example embodiment. In another embodiment, to improve throughput, the second cavity 652 may be preemptively pressurized with positive pressure prior to the substrate 102 being positioned underneath the superstrate 108. Furthermore, during a calibration step prior to the moment shown in FIG. 8A, negative pressure may be applied in the second cavity 652 using the fluid path (not shown, equivalent to fluid path 154 of the superstrate chuck assembly 118 of the first example embodiment). At the moment shown in FIG. 8A, the pressure P in the second cavity is preferably equal to atmospheric pressure, but may also be positively pressurized or negatively pressurized. The substrate chuck 104 may also include a separation initiator 110. The separation initiator 110 may be a pushpin in one example embodiment. The separation initiator 110 may reside within a passageway extending through the superstrate chuck 104. The separation initiator 110 is configured to move upwardly as part of a method of separating the superstrate 108 from the cured layer 146, which is discussed below.

The method may then proceed to step S704, where the second cavity 652 of the superstrate chuck assembly 618 is pressurized with positive pressure. FIG. 8B shows a schematic cross section of the superstrate chuck assembly 618 after the second cavity 652 has been pressurized. The second cavity 652 may be pressurized by imparting a positive pressure P via the fluid path (not shown, equivalent to the fluid path 154 of the superstrate chuck assembly 118 of the first example embodiment). The amount of pressure P may be selected such that it is sufficient to bow the superstrate 108 with a desired curvature, as shown in FIG. 8B. The pressure P may be set to 0.1 to 10 kPa. At the same time, the vacuum suction is applied to the first cavity 648. Thus, during step S704, the member 630 remains attached to the superstrate 108 via the first cavity 648. As also shown in FIG. 8B, because the positive pressure P, and the bowing of the superstrate 108, the flexible portion 634 of the member 630 will bend/bow as well. The second cavity 652 may be positively pressurized to pressure P prior to moving the superstrate chuck assembly 618 toward the substrate 102 or as the superstrate chuck assembly 618 moves toward the substrate 102. In the case that the pressurizing occurs while the superstrate chuck assembly 618 moves toward the substrate 102, the target pressure should be reached prior to the superstrate 608 coming into contact with the formable material 124.

The method may proceed to step S706, where the superstrate 108 is brought into contact with the drops of formable material 124 on the substrate 102 to form a film layer 144. FIG. 8C shows a schematic cross section of the superstrate chuck assembly 618 just before the bowed superstrate 108 comes into contact with the drops of formable material 124. As shown in FIG. 8C, the positive pressure P is still maintained and the vacuum suction is still applied to the first cavity 148 up until this moment. In an embodiment, the pressure P in the second cavity 652 is increased as the superstrate 108 conforms with the formable material 124 to maintain a desired curvature. The applicant has determined that it often requires more pressure to maintain a certain superstrate curvature as the un-conformed region of the superstrate decreases. As a contact area of the superstrate increases during step S706 the contact area of the superstrate begins to conform to the shape of the superstrate under the contact area, while the portion of the superstrate outside the contact area is the un-conformed region in which the curvature needs to be controlled. Maintaining this curvature is important for minimizing gas trapping which can lead to non-fill defects. In an embodiment, the curvature just beyond the conformed portion (contact area) of the superstrate is controlled. In other words, the curvature of the superstrate in an annular region just outside the contact area is controlled. In an embodiment, a desired superstrate curvature profile in this annular region is controlled while formable material spreads underneath the contact area. This may require that the pressure P be maintained and/or increased during step S706. In an embodiment, the superstrate 108 is 'flat' (conforms to the shape of the substrate 102) after the formable material has stopped spreading.

Figure 8D:
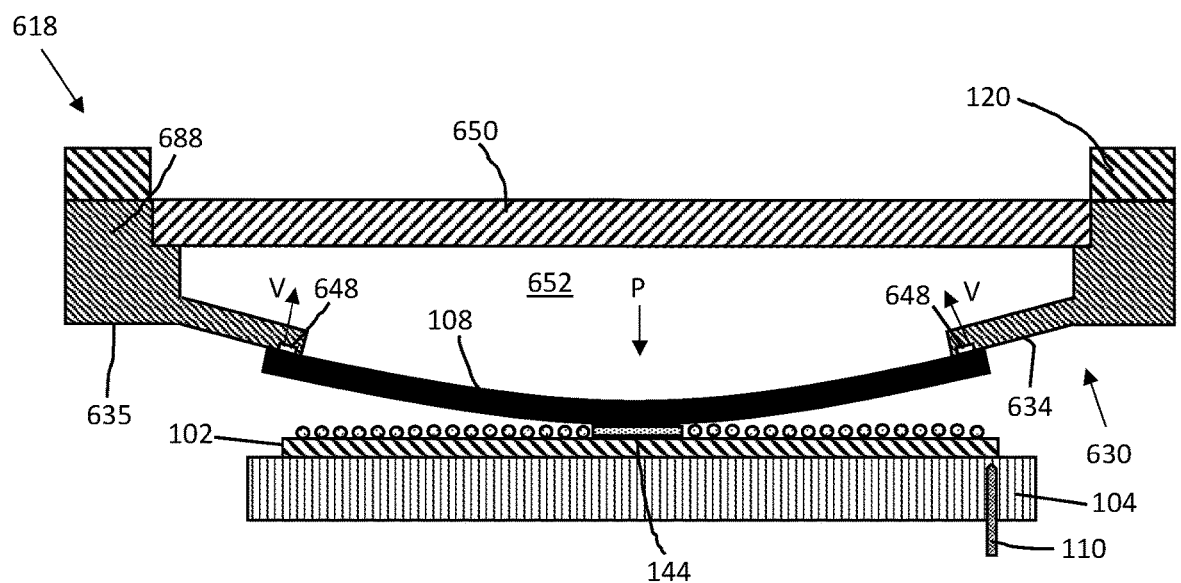

FIG. 8D shows a schematic cross section of the superstrate chuck assembly 618 as it continues to move downwardly toward the substrate 102 to form the film 144. As shown in FIG. 8D, as the superstrate chuck assembly 618 continues to move the superstrate 108 downwardly, a film 144 of the formable material 124 begins to form in an area between the center of the superstrate 108 and the substrate 102. Simultaneously with this action, the positive pressure P in the second cavity 652 may be maintained or increased so that as the superstrate 108 is pressed against the formable material 124, the superstrate 108 will maintain the desired curvature in the area of the superstrate that is about to conform with the formable material. Preferably, the pressure P is increased. That is, as seen in FIG. 8D as compared to FIG. 8C, the superstrate 108 has less of an arc in FIG. 8D such that the area of the superstrate that is about to conform with the formable material maintains the desired curvature. At the same time the flexible portion 634 of the member 630 also has a flatter shape in FIG. 8D as compared to FIG. 8C as it in turn begins to flatten along with the superstrate 108.

Figure 8E:
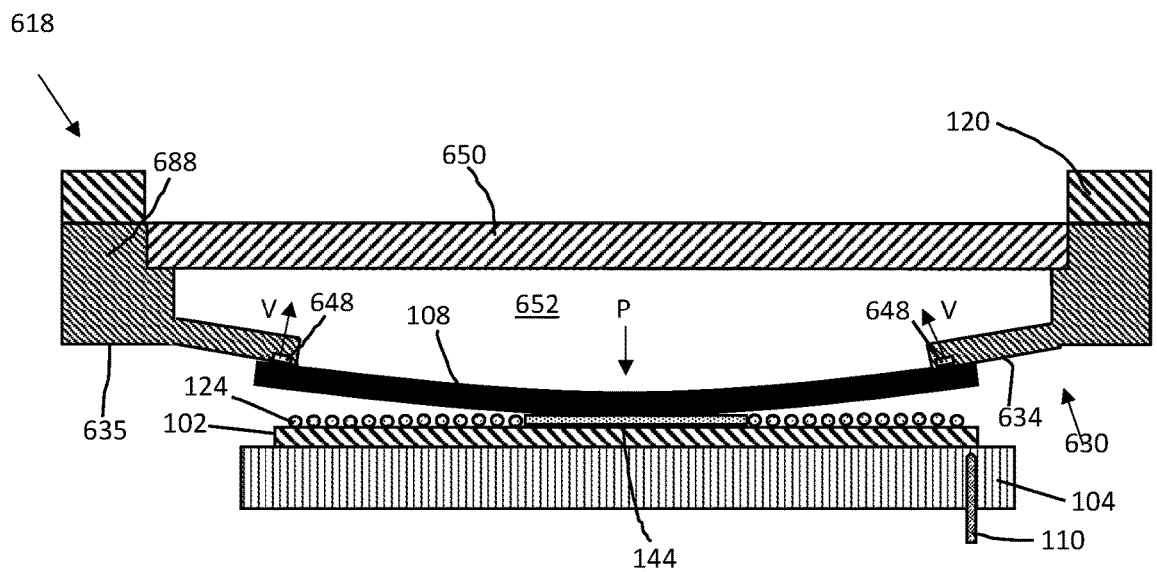

FIG. 8E shows a schematic cross section of the superstrate chuck assembly 618 at a point where the superstrate 108 is has been further pushed toward the substrate 102. As seen in FIG. 8E, as the superstrate 108 continues to press downwardly, the film 144 of formable material 124 spreads further along the surface of the substrate 102 toward the edges. The positive pressure P is further increased or maintained so as to maintain the desired curvature in the area of the substrate that is about to conform with the formable material. Preferably, the pressure P is further increased. Thus, as the superstrate 108 continues to press downwardly toward the substrate 102, the superstrate 108 continues to bend to maintain the desired curvature in the area of the substrate that is about to conform with the formable material. That is, the superstrate 108 in FIG. 8E has less of an arc than in FIG. 8D such that the area of the superstrate that is about to conform with the formable material maintains the desired curvature. At the same time, the flexible portion 634 also continues to flatten relative to FIGS. 8C and 8D. That is, the flexible portion 634 is flatter in FIG. 8E than in FIG. 8D. The vacuum suction is still applied to the first cavity 648 throughout the positions shown in FIGS. 8D and 8E.

Figure 8F:
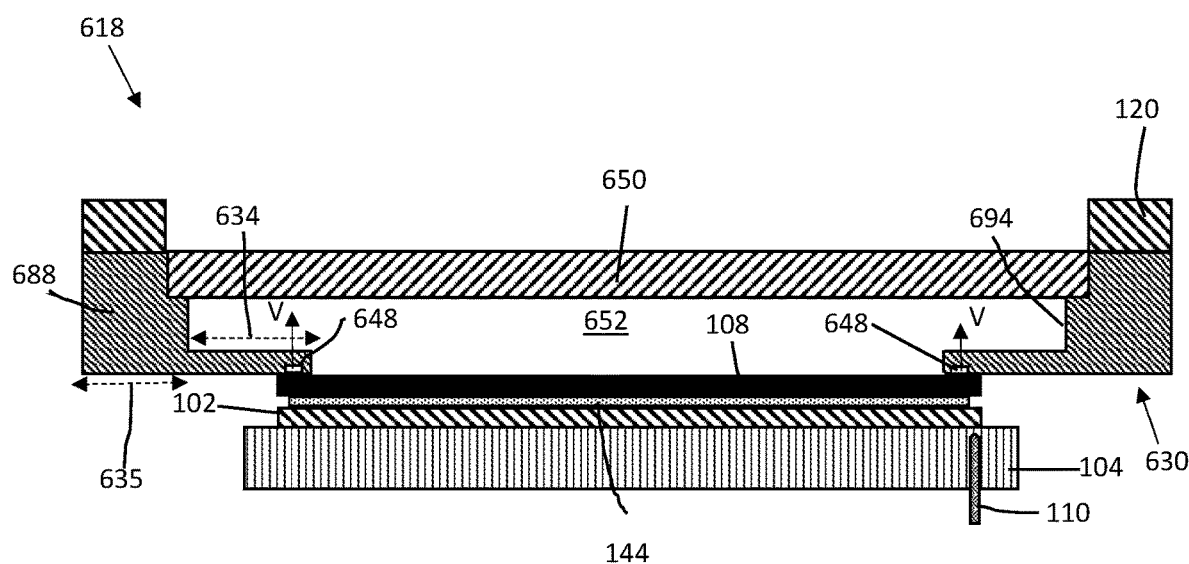

FIG. 8F shows a schematic cross section of the superstrate chuck assembly 618 at a point where the superstrate 108 has been fully pressed against the formable material 124 such that the film 144 is fully formed. As shown in FIG. 8F, the superstrate 108 has been pressed until it is once again flat. That is, the superstrate 108 no longer has an arc or lacks a substantial arc. Similar, the flexible portion 634 of the member 630 is flat or lacks a substantial bend. The positive pressure in the second cavity 652 at this point is completely removed or open to atmosphere. The vacuum suction is still applied to the first cavity 648, as the moment shown in FIG. 8E is prior to curing and prior to the release process described below.

Figure 8G:
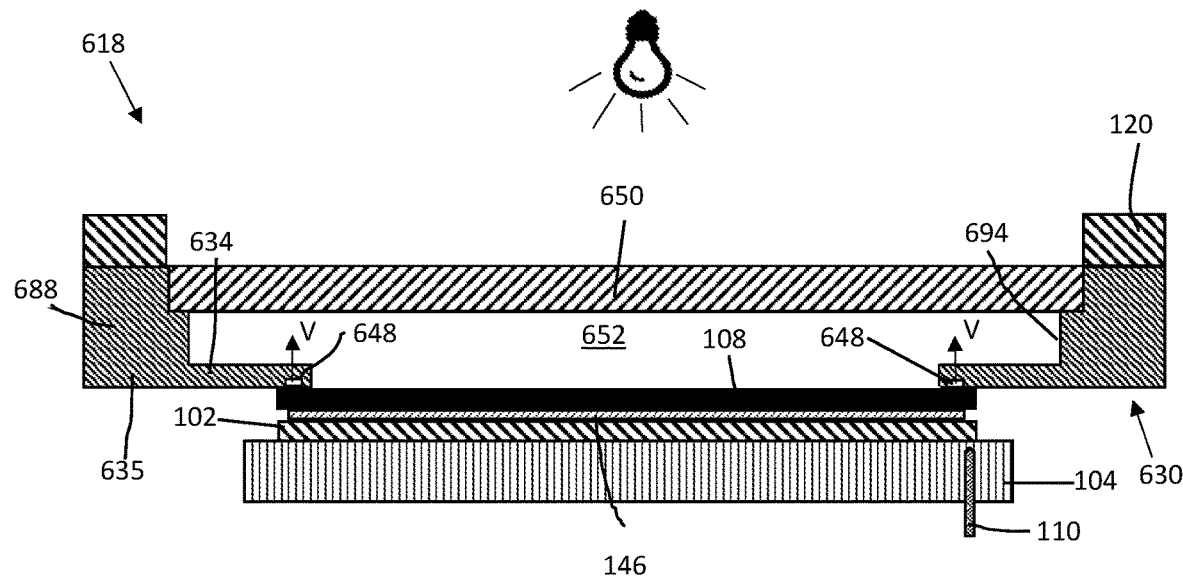

The method may then proceed to step S708, where the formed film 144 located between the superstrate 108 and the substrate 102 is cured. FIG. 8G shows a schematic cross section of the superstrate chuck assembly 618 during the curing step of step S708 in accordance with a first example embodiment. In the first example embodiment, the curing step may be performed in the manner noted above using the curing system. The radiation source 126 may emit, for example, UV radiation that is directed through the light-transmitting member and through the superstrate 108, each of which allow the UV radiation to pass through. In an embodiment the member 630 may be transparent to the UV radiation so that the member will not interfere with the curing process. In another embodiment the member 630 need not be transparent with respect to UV radiation. In a case that the member 630 is opaque with respect to UV radiation, the member 630 will need to be moved relative to a multilayer structure (substrate 102; uncured formable material 124; and superstrate 108) while the uncured formable material 124 in the multilayer combination is being cured during step S708. In this first example embodiment, where the UV radiation passes through the light-transmitting member, the light-transmitting member 150 may be composed of a material that transmits greater than 80% of light having a wavelength of 310-700 nm (i.e., UV light and visible light), e.g., sapphire, fused silica). After exposure to the UV radiation, the film 144 of formable material is cured, thereby forming a hardened cured layer 146. During the curing process the pressure P in the second cavity 652 may continue to be atmospheric and the vacuum suction may be still applied to the first cavity 648.

Figure 8H:
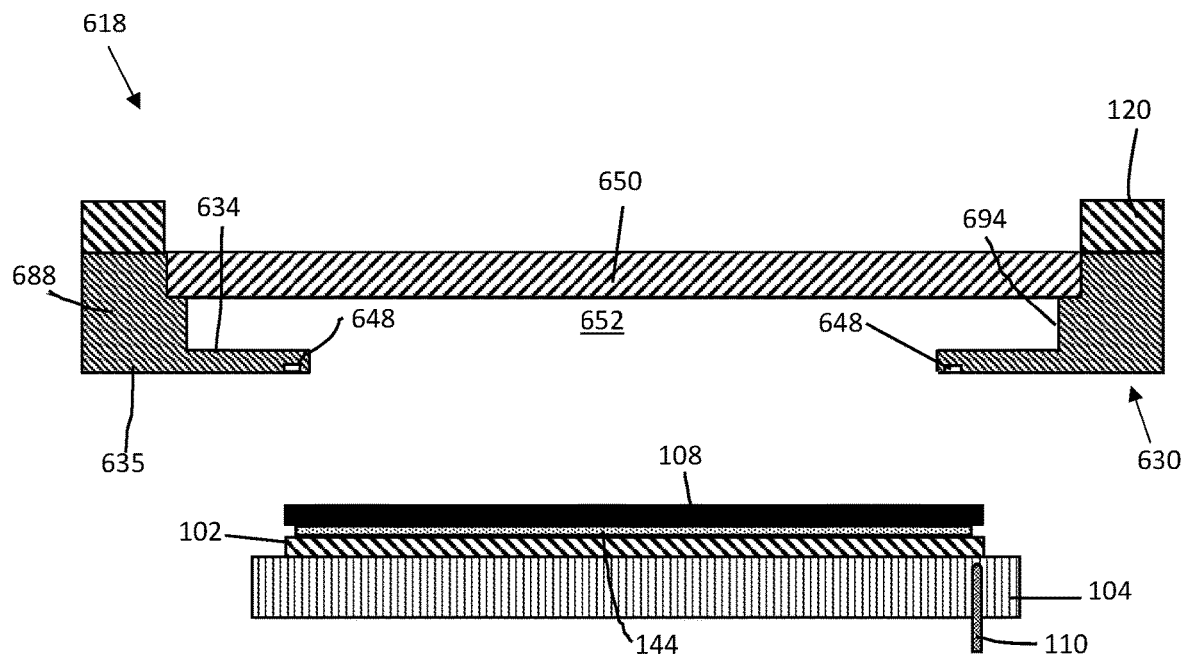
Figure 8I:
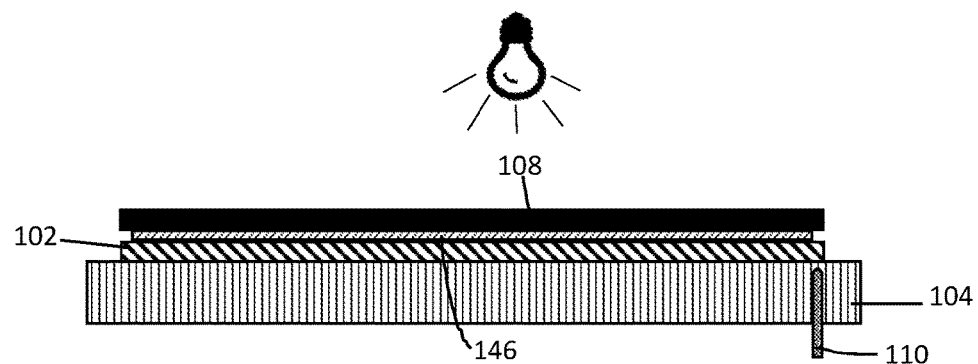

FIGS. 8H and 8I show a schematic cross section of the superstrate chuck assembly 618 during the curing step of step S708 in accordance with a second example embodiment. In the second example embodiment, as shown in FIG. 8H, the superstrate 108 is first released from the member 630. Thus, at this moment the vacuum applied to the first cavity 648 has been terminated. After the superstrate 108 has been released from the member 630, the combination of superstrate 108/film 144/substrate 102/substrate chuck 104 may be moved via the stage to another location. As shown in FIG. 8I, once the combination of superstrate 108/film 144/substrate 102/substrate chuck 104 is present at the other location, the curing process can be performed. As in the first embodiment, the curing may be performed by exposing the film 144 to UV light through the superstrate 108. However, because the combination of superstrate 108/film 144/substrate 102/substrate chuck 104 is at another location and no longer coupled to the superstrate chuck assembly 118, the UV light does not need to pass through the light-transmitting member 650 or through the member 630. In this second example embodiment, where the UV radiation does not pass through the light-transmitting member, the light-transmitting member 650 may be composed of a material that transmits greater than 80% of light having a wavelength of 400-700 nm (i.e., visible light and not UV light), e.g., glass, borosilicate, and does not need to be composed of a material that transmits UV light. After the curing is complete, the combination of superstrate 108/cured film 146/substrate 102/substrate chuck 104 may be brought back underneath the superstrate chuck assembly 618.

Figure 8J:
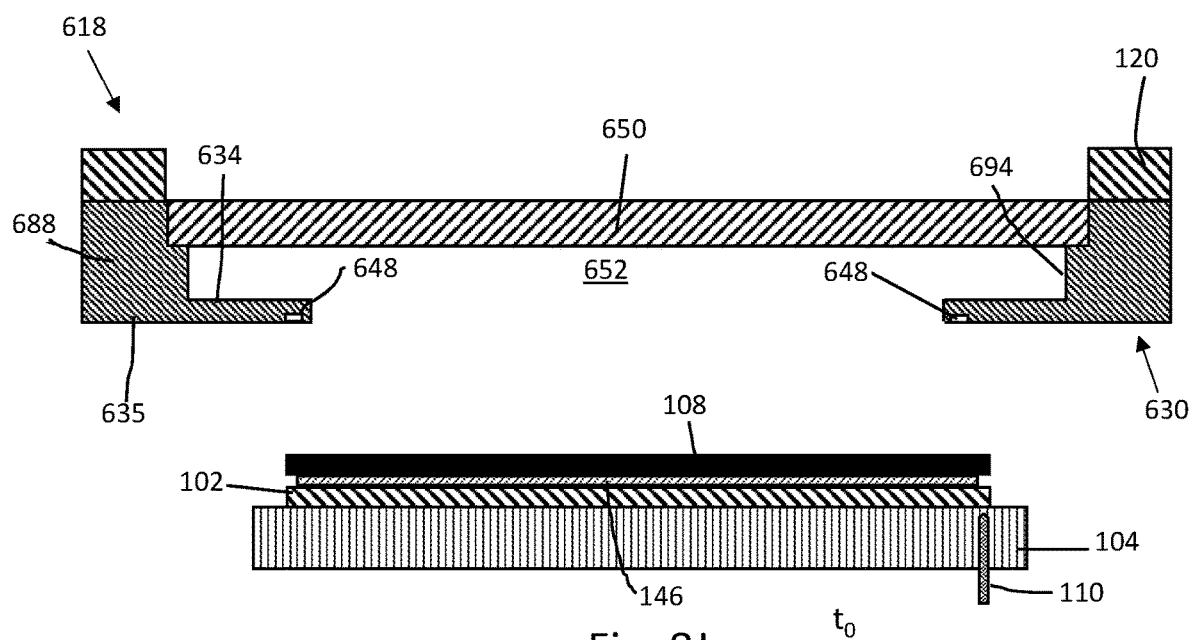
Figure 8K:
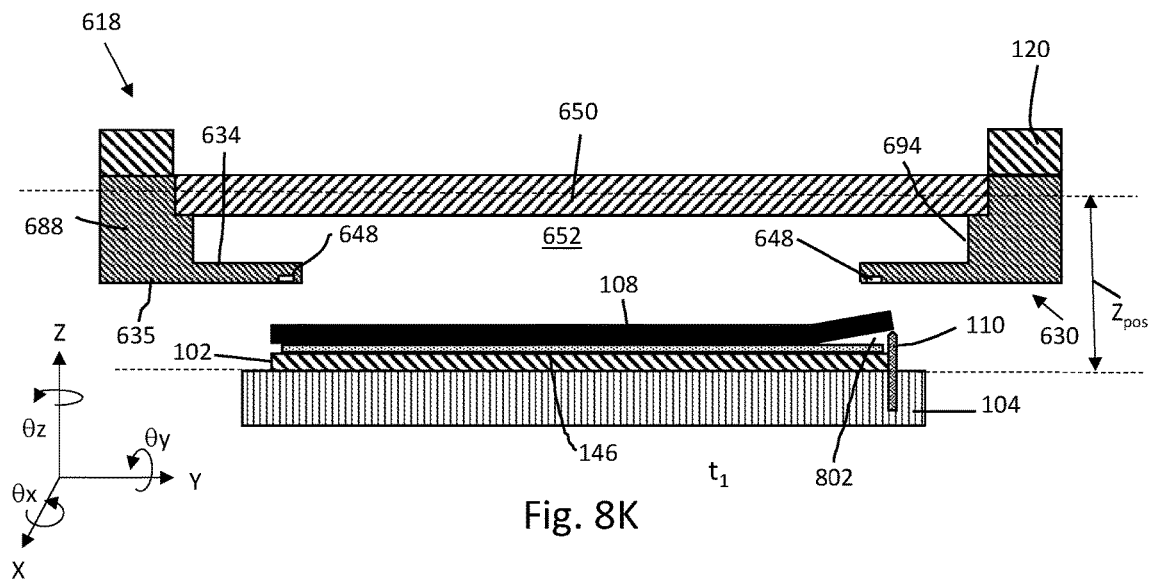

The method may then proceed to step S710, where the superstrate 108 is separated from the cured layer 146. The details of the method of separating 702 the superstrate 108 from the cured layer 146 is shown in the flowchart of FIG. 7B. FIGS. 8J to 8R show schematic cross sections of the superstrate chuck assembly 118 corresponding to the steps of the separation method 702 shown the flowchart of FIG. 7B. FIG. 9 shows a top schematic view of the combination of superstrate 108/cured layer 146/substrate 102/substrate chuck 104 corresponding to the steps of the separation method shown in the flowchart of FIG. 7B. FIG. 10A is a timing chart representing a Z dimension position of the plate chuck assembly 618 during the method of separating 702 the superstrate 108 from the cured layer 146 of FIG. 7B. FIG. 10B is a timing chart representing a tilt of the plate chuck assembly during the method of separating the superstrate from the cured layer of FIG. 7B in accordance with the example embodiment of FIGS. 8J to 8R and 9.

Prior to beginning the method of separating the superstrate 108 from the cured layer 146, the combination of superstrate 108/cured layer 146/substrate 102/substrate chuck 104 may be positioned below the superstrate chuck assembly 618 (i.e., not coupled). Alternatively, the combination of superstrate 108/cured layer 146/substrate 102/substrate chuck 104 may already be coupled with the superstrate chuck assembly 618. The first instance is shown in FIG. 8J, which corresponds to the curing embodiment shown in FIGS. 8H and 8I, i.e., where the curing occurs at a separate location. After the curing is complete, the combination superstrate 108/cured layer 146/substrate 102/substrate chuck 104 is brought underneath the superstrate chuck assembly 618. In the case of the curing embodiment shown in FIG. 8G, the superstrate 108 was never decoupled from the superstrate chuck assembly 618, and therefore, the combination of superstrate 108/cured layer 146/substrate 102/substrate chuck 104 would still be coupled with the superstrate chuck assembly 618. In either case, this same moment in time is schematically represented by state 902 in FIG. 9. As shown in FIG. 9, as the separation process has not yet begun at position 902, there is no indication of a separation between the superstrate 108 and the cured layer 146. That is, in position 902 of the FIG. 9, there is only an unseparated portion 903 and no separated portion. Furthermore, as shown in FIGS. 8A to 8J, because the separation method has not yet begun, the separation initiator 110 is in a retracted position. That is, throughout the steps shown in FIGS. 8A to 8J, the separation initiator 110 has not yet been actuated to come into contact with the superstrate 108.

The method of separating the superstrate 108 from the cured layer 146 begins with step S712 where a separation front is initiated between the cured layer 146 and superstrate 108 at an initial separation point 802. FIG. 8K shows a schematic cross section of the superstrate chuck assembly 618 above the combination superstrate 108/cured layer 146/substrate 102/substrate chuck 104 at the moment when the step S712 is performed to initiate the separation front at the initial separation point 802. At this moment, the location of the superstrate chuck assembly 618 relative to the superstrate in the Z dimension is indicated by $Z_{pos}$ in FIG. 8K. As shown in FIG. 8K the Z position $Z_{pos}$ is defined as the distance between the top surface of the substrate chuck 104 and the midpoint of the member 650 of the superstrate chuck assembly 618.

As shown in FIG. 8K, the initiation of the separation front may be achieved by actuating the separation initiator 110 from a retracted position to an extended position. In the extended position shown in FIG. 8K, the tip of the separation initiator 110 contacts the superstrate 108 at an underside edge of the superstrate 108 and pushes the edge of the superstrate 108 off of the cured layer 146. That is, the force of the separation initiator 110 moving upwardly and contacting the underside edge of the superstrate 108 is sufficient to separate the edge of the superstrate 108 from the edge of the cured layer 146. Position 904 in FIG. 9 shows a schematic top view of the initial separation point 802. As shown in FIG. 9, at position 904, this separation front initiation results in a small separated portion 905 and a large unseparated portion 906. The ratio of the separated area 905 to the unseparated area 906 may be 1:200 to 1:50.

Next, the method may proceed to step S714, where the plate chuck assembly 618 and/or the substrate chuck 104 is tilted away from the initial separation point 802 while the superstrate 108 is held by the flexible portion 634. In order to achieve this, the combination superstrate 108/cured layer 146/substrate 102/substrate chuck 104 is coupled with the superstrate chuck assembly 618. In the illustrated embodiment, where the curing occurs at a different location, the method includes a coupling step shown in FIG. 8L. That is, in the illustrated embodiment, after initiating the separation front at the initial separation point, there is a step of coupling the combination superstrate 108/cured layer 146/substrate 102/substrate chuck 104 with the superstrate chuck assembly 618. At the moment shown in FIG. 8L, the superstrate chuck assembly 618 has been lowered in the Z direction relative to the movement shown in FIG. 8K in order for the flexible portion 634 to come into contact with the superstrate 108. Thus, the $Z_{pos}$ of FIG. 8L is smaller than the $Z_{pos}$ of FIG. 8K.

Figure 8L:
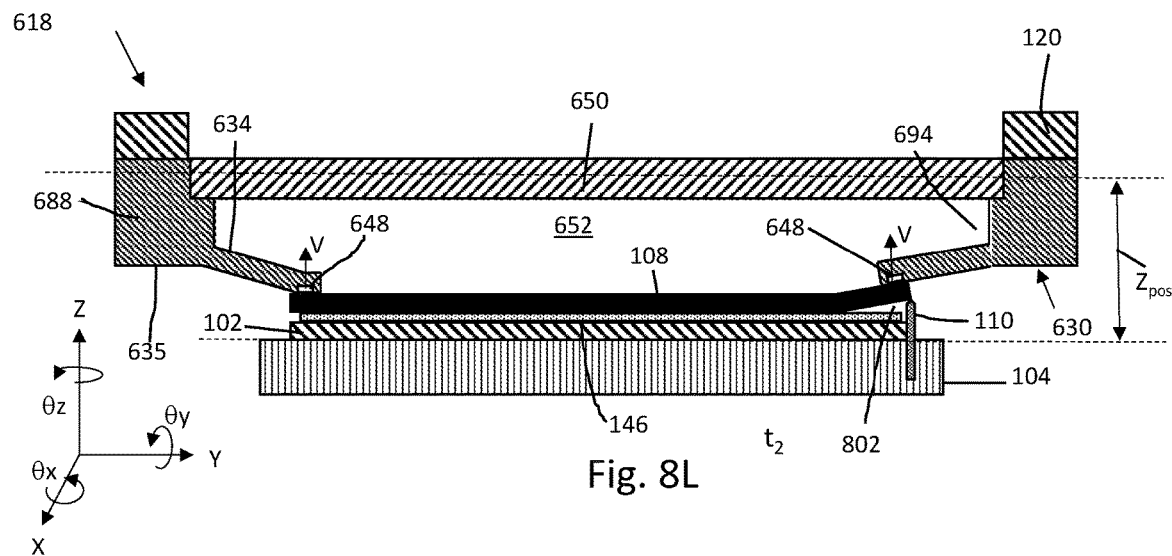
Figure 9:
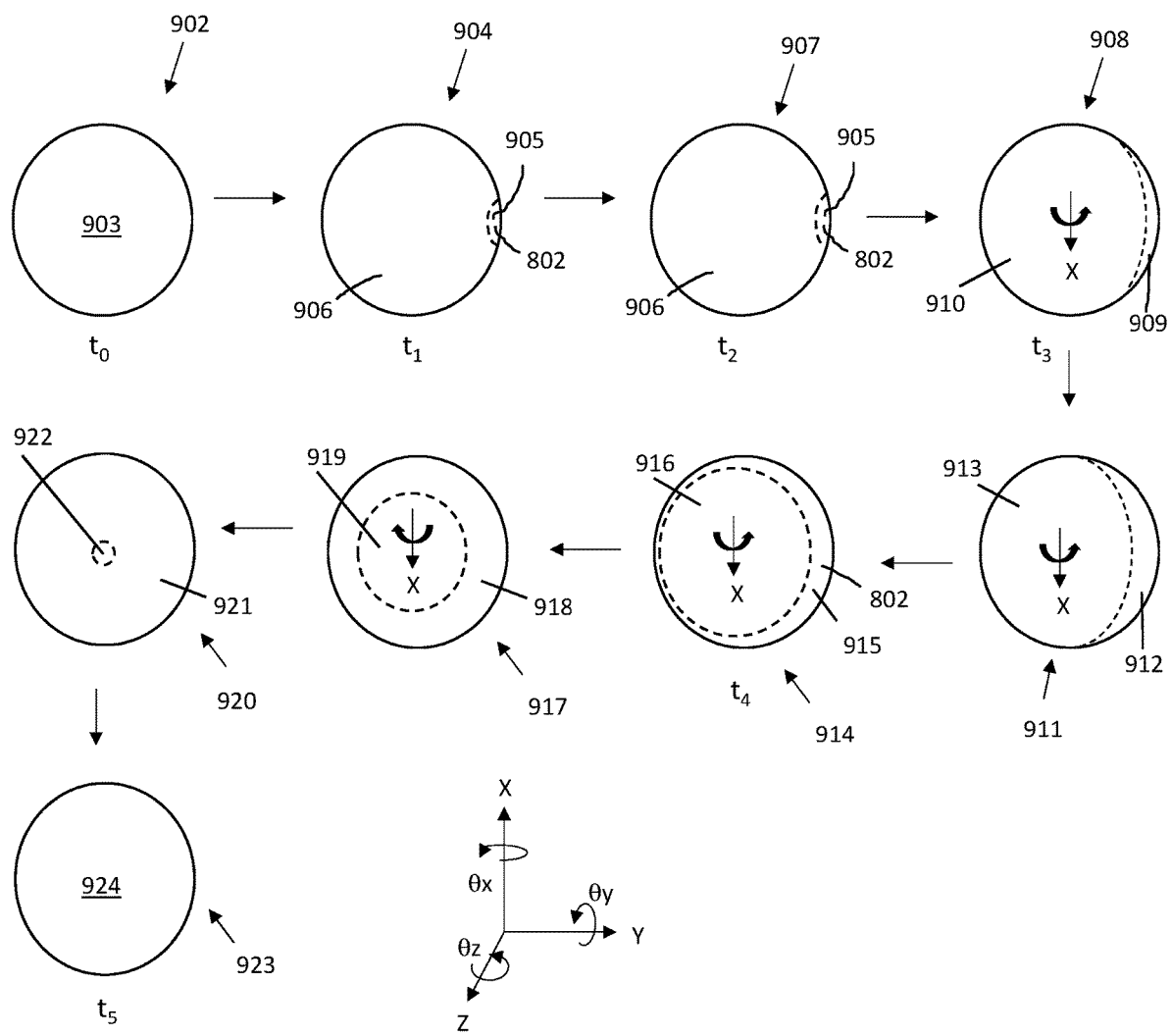
FIG. 9 is a top schematic view of the method of separating the superstrate from the cured layer of FIG. 7B.
Figure 10A:
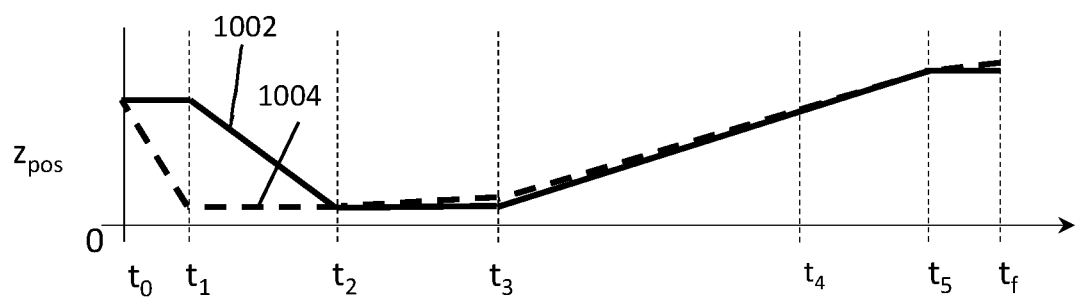
FIG. 10A is a timing chart representing a Z dimension position of the plate chuck assembly during the method of separating the superstrate from the cured layer of FIG. 7B.
Figure 10B:
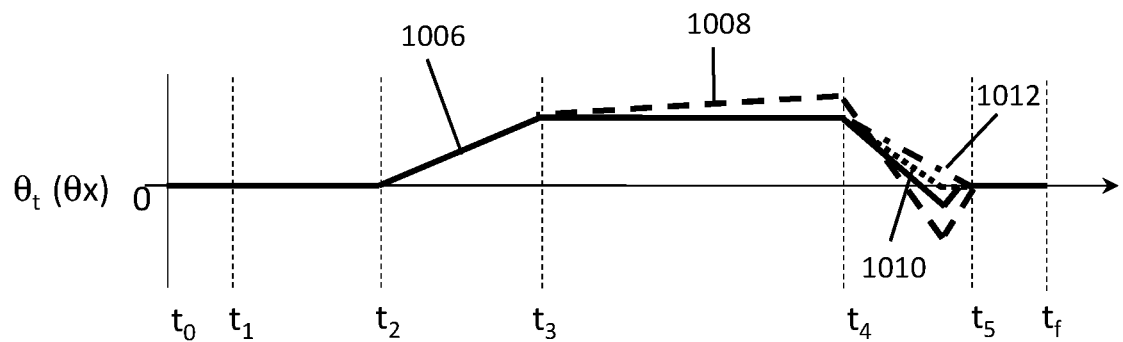
FIG. 10B is a timing chart representing a tilt of the plate chuck assembly during the method of separating the superstrate from the cured layer of FIG. 7B.

The position 907 shown in FIG. 9 is the same moment as shown in FIG. 8L. Thus, because only the coupling has been performed at the position 907, there is no change to the amount of separation. As shown in FIG. 9, at position 907, the same separated portion 905 and same unseparated portion 906 is still present as in the position 904. Thus, the ratio of the separated area 905 to the unseparated area 906 has not changed from the position 904.

In the case where the curing occurs while the combination superstrate 108/film layer 144/substrate 102/substrate chuck 104 remains coupled with the superstrate chuck assembly 618, there is no coupling step because the combination superstrate 108/cured layer 146/substrate 102/substrate chuck 104 is already coupled with the superstrate chuck assembly 618 at the time of initiating the separation front at the initial separation point 802. In either case, the method will ultimately arrive at the position shown in FIG. 8L. Thus, in the case where the curing occurs while the combination superstrate 108/film layer 144/substrate 102/substrate chuck 104 remains coupled with the superstrate chuck assembly 618, the step of actuating the separation initiator 110 occurs while the combination superstrate 108/film layer 144/substrate 102/substrate chuck 104 is coupled with the superstrate chuck assembly 618.

Figure 8M:
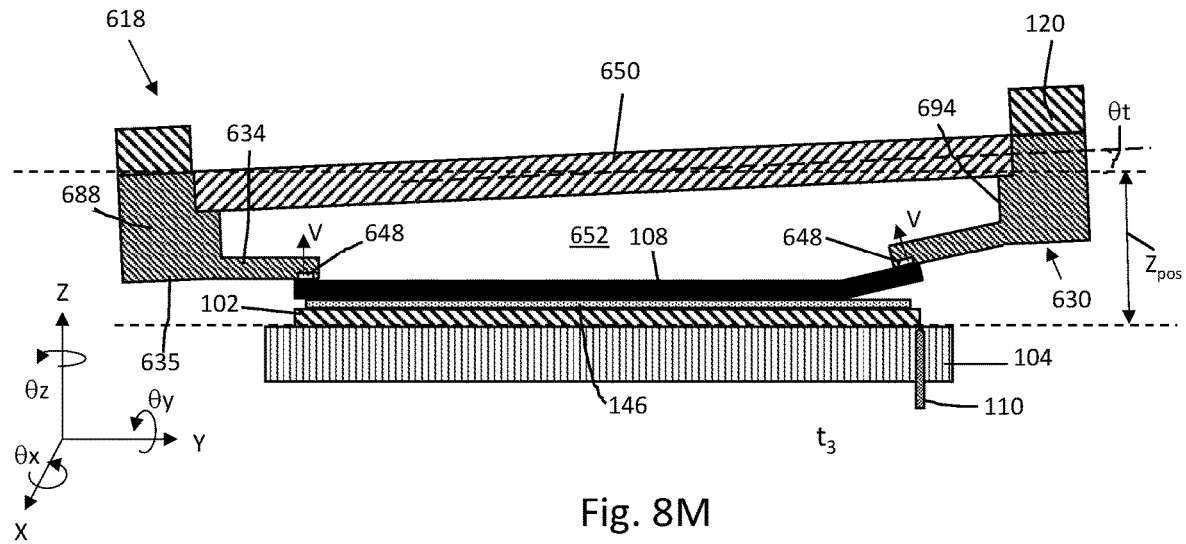

FIG. 8M shows the beginning of the tilting away from the initial separation point 802 as part of the step S714. In the illustrated example embodiment, the superstrate chuck assembly 618 is being tilted. However, in another embodiment, the substrate chuck 104 may be tilted. In yet another embodiment both can be tilted. When both are tilted, the two are tilted in opposite directions. As shown in FIG. 8M, the tilt θt may be applied by rotating the superstrate chuck assembly 618 about the X axis (θx) in a counterclockwise direction. When the rotation is about the X axis (θx), the tilt may also be referred to as $θ_{tx}$. By rotating about the X axis (θx) in a counterclockwise direction, the portion of the superstrate 108 that is located at the initial separation point 802 is lifted upwardly. The same principle can also be applied when the separation point is at the other side of the superstrate 108 (i.e., the opposite side in the Y axis than in the illustrated embodiment). In that case, the tilt $θ_t$ would be about the X axis (θx) in the clockwise direction. As shown in FIG. 8M, during the tilting, the coupling of the superstrate 108 with the superstrate chuck assembly 618 is maintained by maintaining the vacuum applied to the cavity 648. In the illustrated embodiment of FIG. 8M, there has not been any Z dimension movement of the superstrate chuck assembly 618 and thus the $Z_{pos}$ of FIG. 8M is the same as the $Z_{pos}$ in FIG. 8L.

Position 908 of FIG. 9 shows the schematic top view of the separation corresponding to the moment shown in FIG. 8M. As shown in FIG. 9, by performing the tilting, the separation front of the superstrate 108 from the cured layer 146 begins to propagate along the circumference of the substrate, thus providing the separated area 909 and the unseparated area 910. The ratio of the separated area 909 to the unseparated area 910 may be 1:150 to 1:10.

The amount of tilt $θ_t$ may be 0.01 milliradians to 10 milliradians relative to the horizontal Y axis in the cross section view and relative to a horizontal plane.

Figure 8N:
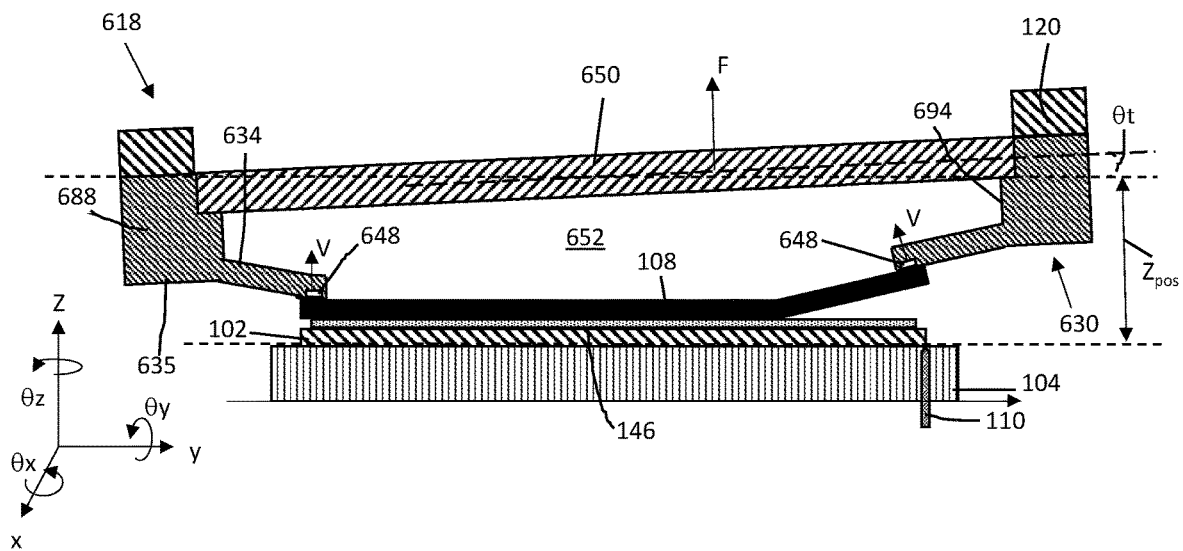

The separation method may then proceed to step S716 where a force F is applied to the superstrate chuck assembly 618 and/or the substrate chuck 104 in a direction away from the other while maintaining or increasing the tilt $θ_t$. The application of the force F increases the $Z_{pos}$. FIG. 8N shows an example embodiment at a moment when the force F is being applied to the superstrate chuck assembly 618 in an upward direction along the Z axis to increase the $Z_{pos}$. The amount of tilt $θ_t$ is the same in FIG. 8N as compared to FIG. 8M. That is, in the illustrated example embodiment, the force F is applied to the plate chuck assembly 618 away from the substrate chuck 104 to increase the $Z_{pos}$, while the substrate chuck 104 is stationary, and the amount of tilt $θ_t$ is maintained from the previous step. However, in another embodiment, the force F can be applied downwardly in the Z direction on the substrate chuck 104 while the plate chuck assembly 618 stationary to achieve the same $Z_{pos}$ increase. In yet another embodiment, forces can be applied to both of the superstrate chuck assembly 618 and the substrate chuck 104. In that case, the forces would be opposite each other, such that one force is applied to the substrate chuck 104 in a downward Z direction and another opposing force is applied to the superstrate chuck assembly 618 in an upward Z direction, thereby achieving the same $Z_{pos}$ increase. Furthermore, in any of these embodiments, the amount of tilt $θ_t$ can be increased instead of being maintained. In the case of increasing the tilt $θ_t$, the tilt $θ_t$ can be increased by 0.01 to 10 milliradians relative to the tilt $θ_t$ in the previous step.

Position 911 of FIG. 9 shows the schematic top view of the separation corresponding to the moment shown in FIG. 8N. As shown in FIG. 9, as a result of the upward force F to increase the $Z_{pos}$, the separation front continues to propagate further along the circumference of the substrate 102, thus providing the separated area 912 and the unseparated 913. The separated area 912 in the position 911 is smaller than the unseparated area 913 in the position 911. The ratio of the separated area 912 to unseparated area 913 may be 1:50 to 1:4.

Figure 8O:
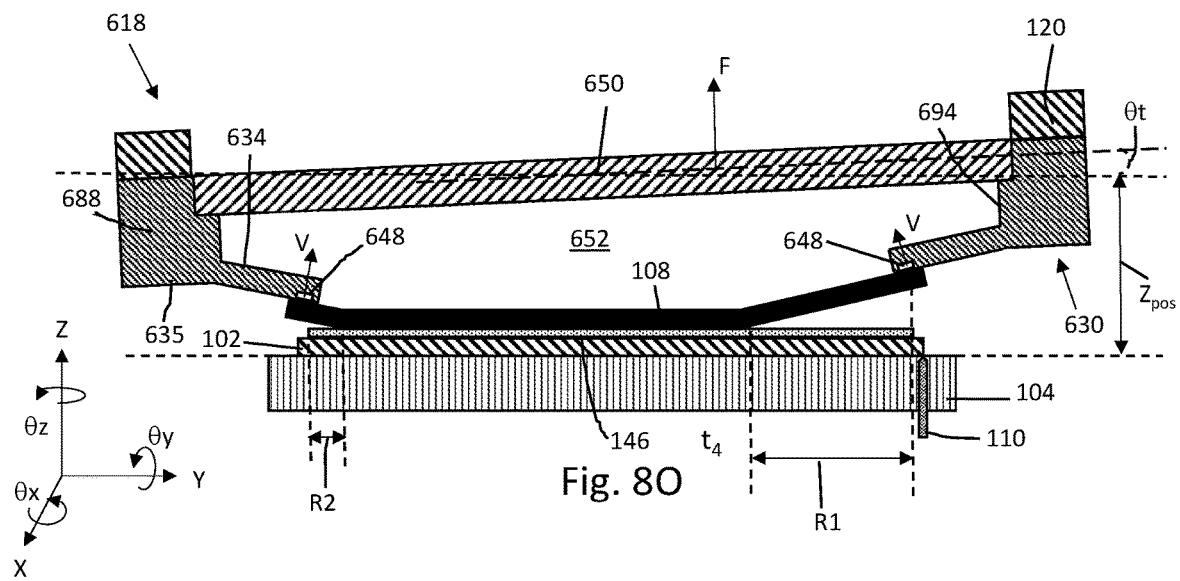

The separation method 702 may then proceed to step S718 where the force F is continued to be applied to the plate chuck assembly and/or the substrate chuck in the direction away from the other, thereby increasing the $Z_{pos}$ until the plate no longer contacts the cured layer. That is, in one example embodiment, simply continuing to apply the force F may be sufficient to completely separate the superstrate 108 from the cured layer 146. FIG. 8O shows an example embodiment at a moment when the force F is continued to be applied to the plate chuck assembly 618 in an upward direction along the Z axis to continue to increase $Z_{pos}$. In FIG. 8O, the tilt $\theta_t$ has remained constant from the previous steps. As shown in FIG. 8O with the continued application of force F, while maintaining the tilt $\theta_t$, the separation between the superstrate 108 and the cured layer 146 begins to reach the radial opposite point along the circumference of the substrate 102 relative to the initial separation point 802. At this moment, the separation front is just beginning at the point opposite the initial separation point 802 (i.e., the separation front is very close to the edge at the opposite end), while the separation front propagation at the initial separation point 802 has increased much farther toward the center of the substrate 102. For example a ratio of the radial distance of separation from the initial separation point 802 edge R1 to a radial distance of separation from the radially opposite point R2 may be 10:1 to 2:1.

Position 914 of FIG. 9 shows the schematic top view of the separation corresponding to the moment shown in FIG. 8O. As shown in FIG. 9, as a result of the continued upward force F increasing the $Z_{pos}$, and maintaining the tilt $\theta_t$, the separation front continues to propagate further along the circumference of the substrate 102, thus providing the separated area 915 and unseparated area 916. The separated area 915 in the position 914 has propagated completely around the circumference of the substrate 102, but the separation front is much further toward the center of the substrate 102 on the initial separation point 802. Thus, the separated area 915 is smaller than the unseparated area 916 in the position 914. The ratio of the separated area 915 to unseparated area 916 may be 1:20 to 1:2. As above, the force F can also be continually applied downwardly on the substrate chuck 104 instead of upwardly on the superstrate chuck assembly 618 or both opposing forces can be continuously applied at the same time to achieve the same result.

In one example embodiment, the continued application of force F is enough to continue to propagate the separation front until there is a complete separation of the entire superstrate 108 from the entire cured layer 146, in which case the method would skip to the moment shown in FIG. 8R and position 923 of FIG. 9. However, in the illustrated example embodiment, additional intermediary steps are shown that further improve the separation.

Figure 8P:
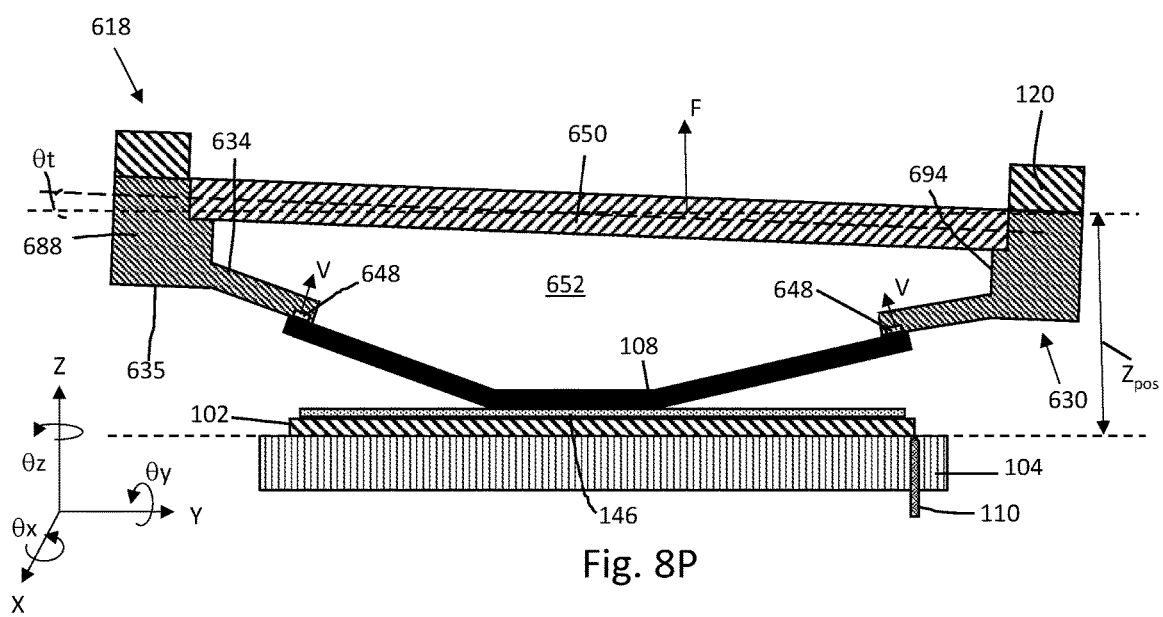

The first additional intermediary step is illustrated in FIG. 8P. In the first additional step, while continuing to apply the force F, the plate chuck assembly 618 and/or the substrate chuck 104 is tilted toward the initial separation point 802. In the illustrated example embodiment, the superstrate chuck assembly 618 is being tilted. However, in another embodiment, the substrate chuck 104 may be tilted. In yet another embodiment both can be tilted. When both are tilted, the two may be tilted in opposite directions.

As shown in FIG. 8P, the tilt $\theta_t$ may be changed by rotating the superstrate chuck assembly 618 about the X axis ($\theta x$) in a direction opposite the direction of the tilt in FIGS. 8M to 8O. The direction of tilt $\theta_t$ in FIG. 8P is thus in a clockwise rotation in the illustrated example embodiment. By rotating about the X axis ($\theta x$) in a clockwise direction, a significant portion of the superstrate 108 that is located opposite the initial separation point 802 is lifted upwardly. That is, by applying an opposite direction tilt, the separation front is propagated toward the center of the substrate 102 starting from the side opposite the initial separation point 802. Position 917 of FIG. 9 shows the schematic top view of the separation corresponding to the moment shown in FIG. 8P. As shown in FIG. 9, by performing the opposite direction tilt $\theta_t$, the separation of the superstrate 108 from the cured layer 146 propagates toward the center of the substrate 102, thus providing the separated area 918 and the unseparated area 919. The separated area 918 of position 917 may be larger than the separated area 915 of position 914. The ratio of the separated area 918 to unseparated area 919 may be 1:3 to 4:1.

The amount of the opposite direction tilt $\theta_t$ may be 0.01 to 10 milliradians relative to the horizontal Y axis shown in the cross section view and relative to a horizontal plane.

Figure 8Q:
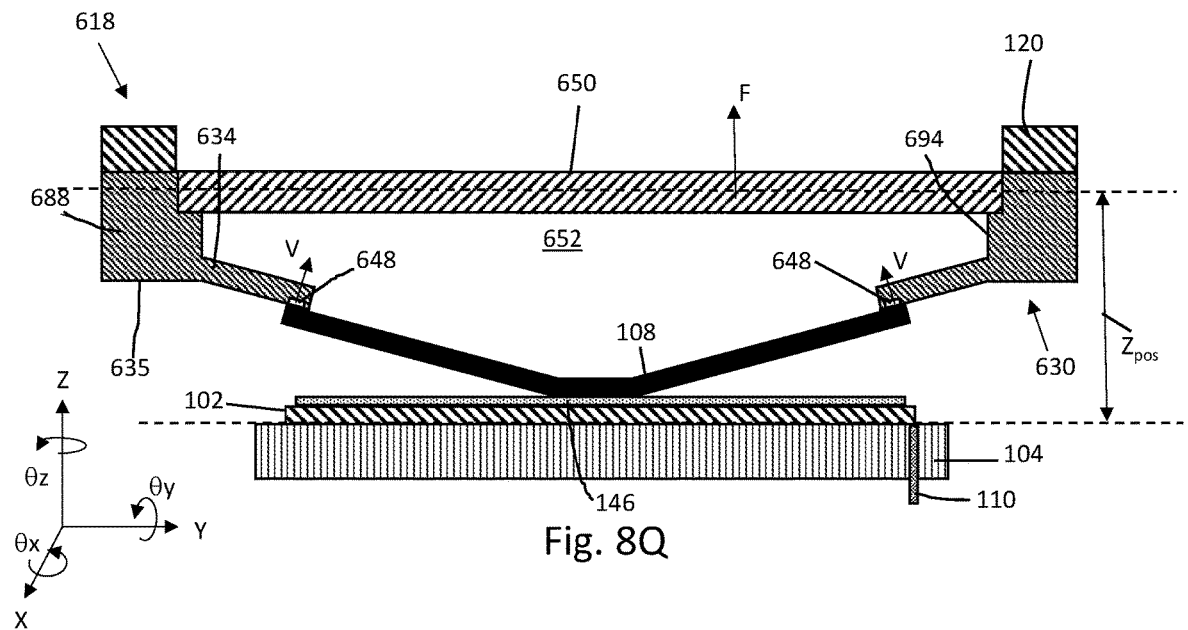
Figure 8R:
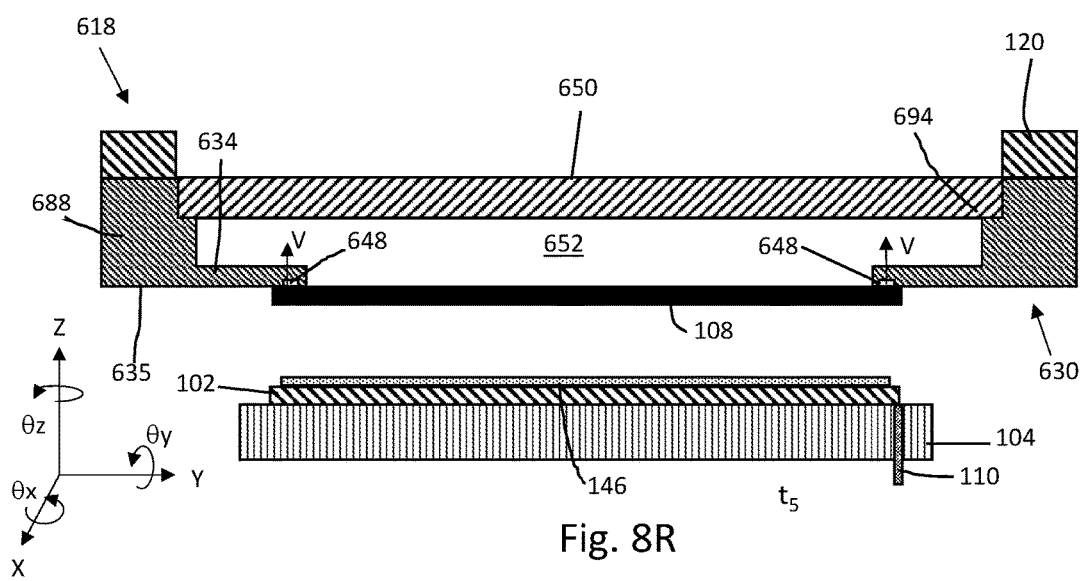

The second additional intermediary step is illustrated in FIG. 8Q. In the second additional step, while continuing to apply the force F upwardly to further increase $Z_{pos}$, the plate chuck assembly 618 and/or the substrate chuck 104 is no longer tilted. In the illustrated example embodiment, the superstrate chuck assembly 618 is no longer tilted. However, in another embodiment, if the substrate chuck 104 had been tilted previously, then the substrate chuck 104 is no longer tilted in the second additional step. In yet another embodiment when both were previously tilted, then both the substrate chuck assembly 618 and the substrate chuck 104 are no longer tilted in the second additional step.

As shown in FIG. 8Q, after the tilt has been removed, the superstrate chuck assembly 618 has returned to a parallel orientation relative to the superstrate chuck 104 as at moment shown in FIG. 8L, i.e., $\theta_t$ is 0. By removing the tilt and continuing to apply the force F, the separation front continues to propagate toward the center of the substrate 102 relative to the entire circumference of the substrate 102. Position 920 of FIG. 9 shows the schematic top view of the separation corresponding to the moment shown in FIG. 8Q. As shown in FIG. 9, by removing the tilt $\theta_t$ and continuing to apply the force F, the separation front of the superstrate 108 from the cured layer 146 propagates greatly toward the center of the substrate 102, thus providing the separated area 921 and a small unseparated area 922. The separated area 921 of position 920 is many times larger than the unseparated area 922 of position 920. The ratio of the separated area 921 to unseparated area 922 may be 50:1 to 500:1.

Continuing to perform the second additional step, where there is no tilt and the force F is continued to be applied, will eventually arrive at the moment shown in FIG. 8R. FIG. 8R shows a moment once the separation of step S710/separation method 702 has been competed just after superstrate 108 has been completely released from the cured layer 146. As shown in FIG. 8R after completing the separation, the superstrate chuck assembly 618 retains the superstrate 108 and the substrate 102 retains the cured layer 146. Position 923 of FIG. 9 shows the schematic top view of the separation corresponding to the moment shown in FIG. 8R. As shown in FIG. 9, after the superstrate 108 is completely separated from the cured layer 146, there is only a separated area 924 and no unseparated area.

The planarization process 700 can then be started again for another substrate by returning to the orientation shown in FIG. 8A. The planarization process 700 may be repeated many times, on the order of tens of thousands. When it is desirable to remove the superstrate 108 from the superstrate chuck assembly 618 (for example after a predetermined number of planarization processes have been completed or if some other indicator suggests that the superstrate should be replaced), the vacuum applied to the first cavity 148 may be released.

The above described method of separating 702, including the process of lifting and tilting the superstrate chuck assembly 618 at FIGS. 8J to 8R and 9 are shown in the timing charts of FIGS. 10A and 10B. The horizontal axis of the timing charts of FIGS. 10A and 10B represents the time where $t_0$ is the start of the separation process and $t_1$ to $t_5$ are different stages of the process, with the tf being the moment that the process is terminated. Each of $t_0$ to $t_5$ appears in the corresponding moment in FIGS. 8J to 8R and 9. Specifically, as indicated in the figures, $t_0$ corresponds to FIG. 8J and position 902, $t_1$ corresponds to FIG. 8K and position 904, $t_2$ corresponds to FIG. 8L and position 907, $t_3$ corresponds to FIG. 8M and position 908, $t_4$ corresponds to FIG. 8O and position 914, and $t_5$ corresponds to FIG. 8R and position 923. The termination of the process tf would occurs after $t_5$, i.e., after complete separation.

FIG. 10A shows a timing chart of the relative position ($Z_{pos}$) of the superstrate chuck assembly 618 in the Z direction during the separation process, where the line 1002 represents the $Z_{pos}$ of the superstrate chuck assembly 618 following the example embodiment of FIGS. 8J to 8R. The dashed line 1004 represents the relative position ($Z_{pos}$) for an alternative embodiment. As seen in FIG. 10A, for the embodiment represented by line 1002, from time $t_0$ to $t_1$ the Z position ($Z_{pos}$) is constant, from time $t_1$ to $t_2$ the $Z_{pos}$ decreases, from time $t_2$ to $t_3$ the $Z_{pos}$ is constant, from time $t_3$ to $t_5$ the $Z_{pos}$ increases, and from the $t_5$ until termination tf the $Z_{pos}$ is constant. Line 1004 shows another embodiment with a similar $Z_{pos}$ curve, except that in the embodiment represented by line 1004, the $Z_{pos}$ may decrease from $t_0$ to $t_1$, stay constant from $t_1$ to $t_2$, slightly increase from $t_2$ to $t_3$, and finally may continue to increase after $t_5$ to termination tf. The decreasing of the $Z_{pos}$ from $t_0$ to $t_1$ represents lowering the superstrate chuck assembly 618 to couple with the superstrate 108 prior to actuating the separation initiator 110 at $t_1$. The increasing of the $Z_{pos}$ after $t_5$ to termination tf shows that the superstrate chuck assembly 618 may continue to lift after the separation is complete at $t_5$.

FIG. 10B shows a timing chart of the relative tilt $\theta_t$ about the X axis ($\theta$x) during the separation process, where the line 1006 represents the tilt $\theta_t$ of the superstrate chuck assembly 618 following the example embodiment of FIGS. 8J to 8R. The dashed line 1008, the dotted line 1010, and the dashed-dotted line 1012 each represent the tilt $\theta_t$ for an alternative embodiment. As seen in FIG. 10B, in the embodiment repressed by line 1006, from time $t_0$ to $t_2$ the tilt $\theta_t$ is constant, from time $t_2$ to $t_3$ the tilt $\theta_t$ increases, from time $t_3$ to $t_4$ the tilt $\theta_t$ is constant, from time $t_4$ to $t_5$ the tilt $\theta_t$ decreases until reaching a negative value before returning back to 0, and from $t_5$ until termination tf the tilt $\theta_t$ is constant. The decrease to negative between $t_4$ and $t_5$ represents the switch from counterclockwise tilt to clockwise tilt as discussed above, where 0 tilt is parallel.

Line 1008 shows another embodiment with a similar tilt $\theta_t$ curve, except that in the embodiment repressed by line 1008, the tilt $\theta_t$ may increase from $t_3$ to $t_4$, then follow a similar pattern to the embodiment represented by line 1006 from $t_4$ to $t_5$. The increasing of the tilt $\theta_t$ from $t_3$ to $t_4$ represents the option of increasing the tilt $\theta_t$ instead of merely maintaining it, which may assist in the separation in some circumstances. The embodiment represented by line 1010 and 1012 are similar to the embodiment represented by line 1006 except that from $t_4$ to $t_5$ the change in the tilt $\theta_t$ never goes below 0. Thus, in these embodiments there is never a clockwise tilt. Furthermore, line 1010 demonstrates a faster change in the tilt $\theta_t$ than line 1012.

Figure 11:
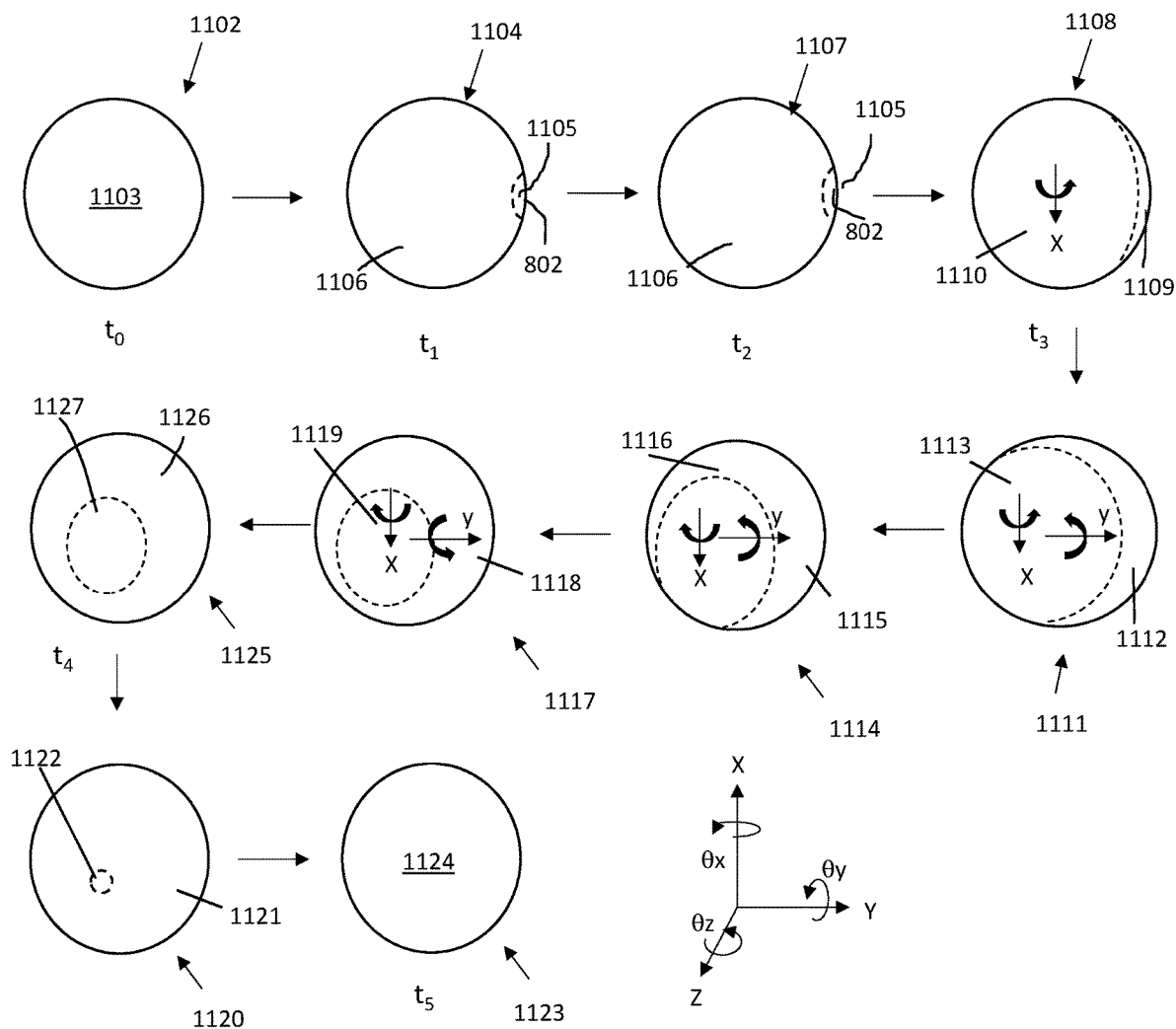
FIG. 11 is a top schematic view of a method of separating the superstrate from the cured layer of FIG. 7B in accordance with another example embodiment.
Figure 12A:
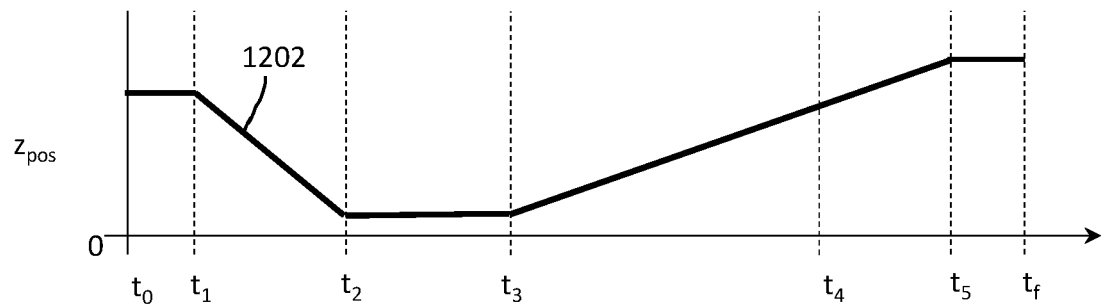
FIG. 12A is a timing chart representing a Z dimension position of the plate chuck assembly during the method of separating the superstrate from the cured layer of FIG. 7B in accordance with the example embodiment of FIG. 11.
Figure 12B:
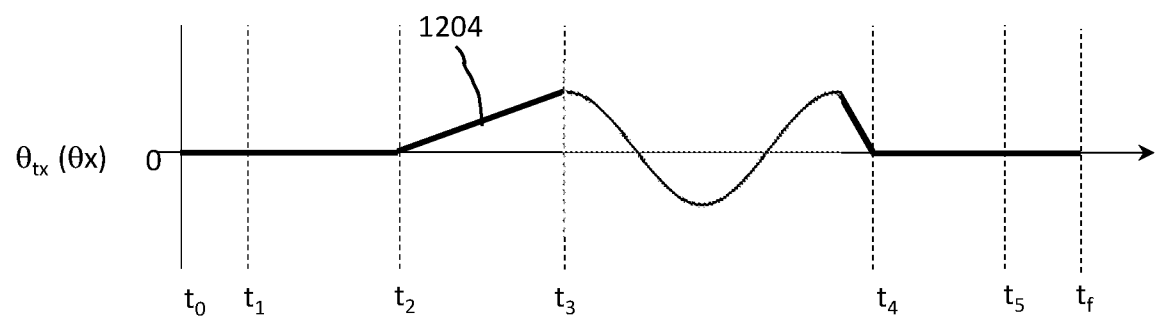
FIG. 12B is a timing chart representing a tilt of the plate chuck assembly in a first direction during the method of separating the superstrate from the cured layer of FIG. 7B in accordance with the example embodiment of FIG. 11.
Figure 12C:
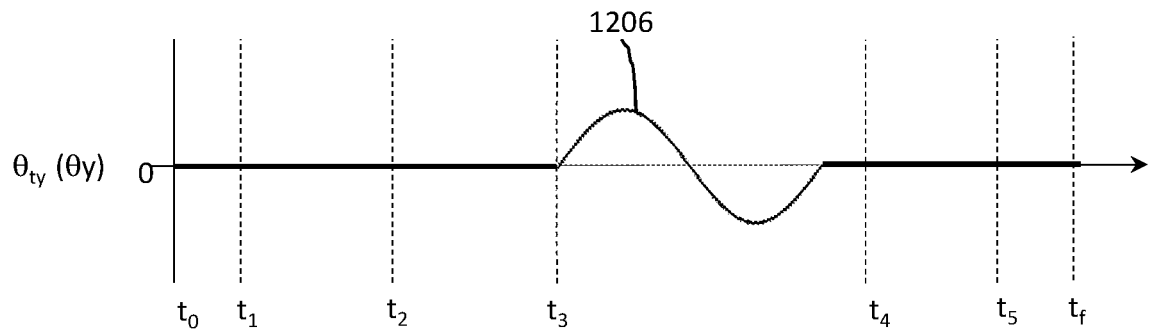
FIG. 12C is a timing chart representing a tilt of the plate chuck assembly in a second direction during the method of separating the superstrate from the cured layer of FIG. 7B in accordance with the example embodiment of FIG. 11.

FIG. 11 shows a top schematic view of another example embodiment of a method of separating a superstrate from a cured layer. The process shown in FIG. 11 is similar to that of FIG. 9, except that a second axis of rotation (Oy) is implemented as part of the separation. That is, in the example embodiment of FIG. 11, during the tilting process, the tilt $\theta_{tx}$ is performed about the X axis ($\theta$x) and a tilt $\theta_{ty}$ is performed about the Y axis ($\theta$y) instead of just the X axis as in the first example embodiment. FIGS. 12A to 12C show timing charts similar to FIGS. 10A and 10B. FIG. 12A shows a line 1202 representing the same relative Z position ($Z_{pos}$) of the superstrate chuck assembly 618 during the separation process according to the embodiment of FIG. 11. FIG. 12B shows a line 1204 representing the tilt $\theta_{tx}$ performed about the X axis ($\theta$x) and FIG. 12C shows a line 1206 representing the tilt $\theta_{ty}$ performed about the Y axis ($\theta$y). Each chart has the same horizontal timing points ranging from $t_0$ to tf similar to FIGS. 10A to 10B. FIG. 11 includes the timing notations corresponding to the times shown in the timing charts of FIGS. 12A to 12C. As shown in FIG. 11, position 1102 corresponds to $t_0$, position 1104 corresponds to $t_1$, position 1107 corresponds to position $t_2$, position 1108 corresponds to $t_3$, position 1125 corresponds to $t_4$, and position 1123 corresponds to $t_5$.

FIG. 11 shows similar positions as in the embodiment of FIG. 9. Positions 1102, 1104, 1107, 1108 are the same as the corresponding positions of FIG. 9. That is, at position the 1102 separation process has not yet started. As position 1104 the separation initiator 110 has been actuated to start the separation. At position 1107 the superstrate chuck assembly 618 has been coupled with the superstrate. At position 1108 the tilt $\theta_{tx}$ about the X axis has been implemented in the same manner as in the embodiment of FIG. 9. However, after position 1108, the separation method is different, as is best shown by the tilt $\theta_{tx}$ timing chart of FIG. 12B and the tilt $\theta_{ty}$ timing chart of FIG. 12C.

As shown in FIG. 12B, from time $t_2$ to $t_3$, which corresponds to position 1107 to position 1108 of FIG. 11, the tilt $\theta_{tx}$ linearly increases while there is no tilt $\theta_{ty}$, similar to the embodiment of FIG. 9. From time $t_3$ to $t_4$, which corresponds to positions 1108, 1111, 1114, 1117, to 1125 of FIG. 11, the tilt $\theta_{tx}$ and the tilt $\theta$ty change. As shown in FIGS. 12A and 12B, the tilt $\theta_{tx}$ begins to parabolically (or another smooth curve) decrease from the maximum reached at $t_3$, while the tilt $\theta_{ty}$ begins to increase parabolically (or another smooth curve) from 0. The tilt $\theta_{tx}$ decreases until reaching a negative value (e.g., switching to clockwise tilt) and then begins increasing until returning back to a positive value (e.g., switching back to counterclockwise tilt). Finally, before reaching $t_4$, the tilt $\theta_{tx}$ once again decreases until reaching 0 (i.e., no tilt). Simultaneously, the tilt $\theta_{ty}$ begins to decrease after the increasing period until eventually reaching a negative value (e.g., switching from counterclockwise to clockwise tilt or vice versa). The tilt θty then begins increasing until reaching 0 (i.e., no tilt) just before reaching time $t_4$. Thus, by time $t_4$, both the tilt $\theta_{tx}$ and the tilt $\theta_{ty}$ are 0 (i.e., no tilt). From time $t_4$ to $t_5$ and ultimately termination tf, there is no longer any tilt and only the $Z_{pos}$ changes as shown in FIG. 12A. The period of lifting from time $t_4$ to $t_5$ includes position 1122 of FIG. 11. Thus, by time $t_5$, which corresponds to position 1123 of FIG. 11, the separation is complete.

The positions shown in FIG. 11, similar to FIG. 9, illustrate the propagation of the separation by following the separation method. Thus, similar to FIG. 9, each of the positions illustrate how much separation there is at various moments in the process. At position 1102 there is only an unseparated area 1103. At position 1104 there is a separated portion 1105 and an unseparated portion 1106. At position 1107 there is the separated portion 1105 and the unseparated portion 1106. At position 1108 there is a separated portion 1109 and an unseparated portion 1110. At position 1111 there is a separated portion 1112 and an unseparated portion 1113. At position 1114 there is a separated portion 1115 and an unseparated portion 1116. At position 1117 there is a separated portion 1118 and an unseparated portion 1119. At position 1125 there is a separated portion 1126 and an unseparated portion 1127. At position 1120 there is a separated portion 1121 and an unseparated portion 1122. At position 1123 there is only a separated portion 1124 and no unseparated portion. The ratio of the area of the unseparated portion to separated portion at positions 1104, 1107, and 1108 of FIG. 11 is the same respective positions 904, 907, and 908 of FIG. 9. The ratio of the separated area 1112 to the unseparated area 1113 of position 1111 may be 1:40 to 1:4. The ratio of the separated area 1115 to the unseparated area 1116 of position 1114 may be 1:10 to 3:4. The ratio of the separated area 1118 to the unseparated area 1119 of position 1117 may be 1:4 to 4:1. The ratio of the separated area 1126 to the unseparated area 1127 of position 1125 may be 1:3 to 5:1. The ratio of the separated area 1121 to the unseparated area 1122 of position 1121 may be 50:1 to 500:1.

By implementing the above-described method of separating 702 as part of the planarization/imprinting process, the plate may be removed from the cured layer without substantially damaging the cured layer.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method of shaping a surface, comprising:
    dispensing formable material onto a substrate;
    contacting a plate held by a plate chuck assembly with the formable material on the substrate held by a substrate chuck, thereby forming a film of the formable material between the plate and the substrate, wherein the plate chuck assembly holding the plate is above the substrate chuck holding the substrate, and the plate chuck assembly includes:
        a flexible portion configured to have a central opening; and
        a cavity formed by the flexible portion, wherein the plate is held by the flexible portion by reducing pressure in the cavity;
    curing the film of the formable material to form a cured layer between the plate and the substrate;
    initiating a separation front between the cured layer and the plate at an initial separation point;
    tilting at least one of the plate chuck assembly and the substrate chuck in a direction away from the initial separation point while the plate is held by the flexible portion, thereby propagating the separation front circumferentially along a perimeter of the cured layer;
    applying a force to at least one of the plate chuck assembly and the substrate chuck in a direction away from the other while maintaining or increasing the tilt of the at least one of the plate chuck assembly and the substrate chuck, until the separation front propagates along the entire perimeter of the cured layer; and
    continuing to apply the force to at least one of the plate chuck assembly and the substrate chuck in the direction away from the other, until the plate does not contact the cured layer.

2. The method of claim 1, further comprising, after applying the force, tilting the at least one of the plate chuck assembly and the substrate chuck toward the initial separation point.

3. The method of claim 1, further comprising, during the applying of the force, increasing an amount of the tilting of the at least one of the plate chuck assembly and the substrate chuck.

4. The method of claim 1, wherein the tilting of the at least one of the plate chuck assembly and the substrate chuck comprises tilting the plate chuck assembly.

5. The method of claim 1, wherein the tilting of the at least one of the plate chuck assembly and the substrate chuck comprises tilting the substrate chuck.

6. The method of claim 1, wherein the applying of the force to at least one of the plate chuck assembly and the substrate chuck comprises applying the force to plate chuck assembly.

7. The method of claim 6, wherein the force applied to the plate chuck assembly is in a direction away from the substrate chuck.

8. The method of claim 6, wherein the force applied to the plate chuck assembly causes the plate chuck assembly to move in a direction away from the substrate chuck.

9. The method of claim 1, further comprising, prior to the curing, releasing the plate from the plate chuck assembly.

10. The method of claim 9, further compromising, after the curing, holding the plate chuck with the plate chuck assembly.

11. The method of claim 10, wherein the initiating of the separation front is performed after the curing and prior to holding the plate chuck with the plate chuck assembly.

12. The method of claim 10, wherein the initiation of the separation front is performed after the curing and after the holding of the plate chuck with the plate chuck assembly.

13. The method of claim 11, wherein the tilting of the at least one of the plate chuck assembly and the substrate chuck comprises tilting 0.01 to 10 milliradians relative a horizontal plane.

14. The method of claim 1, wherein the initiating of the separation front comprises contacting the superstrate with a pushpin.

15. The method of claim 14, wherein the pushpin passes though the substrate chuck.

16. The method of claim 1, further comprising additionally tilting the least one of the plate chuck assembly and the substrate chuck in a direction perpendicular to the tilting away direction.

17. The method of claim 16, further comprising reducing an amount of the tilting away while increasing an amount of the additional tilting.

18. The method of claim 1, wherein the plate is a superstrate having a flat surface or is a template having a patterned surface.

19. A method of manufacturing an article, comprising:
dispensing a formable material on a substrate;
contacting a plate held by a plate chuck assembly with the formable material on the substrate held by a substrate chuck, thereby forming a film of the formable material between the plate and the substrate, wherein the plate chuck assembly holding the plate is above the substrate chuck holding the substrate, and the plate chuck assembly includes:
a flexible portion configured to have a central opening; and
a cavity formed by the flexible portion, wherein the plate is held by the flexible portion by reducing pressure in the cavity;
curing the film of the formable material to form a cured layer between the plate and the substrate;
initiating a separation front between the cured layer and the plate at an initial separation point;
tilting at least one of the plate chuck assembly and the substrate chuck in a direction away from the initial separation point while the plate is held by the flexible portion, thereby propagating the separation front circumferentially along a perimeter of the cured layer;
applying a force to at least one of the plate chuck assembly and the substrate chuck in a direction away from the other while maintaining or increasing the tilt of the at least one of the plate chuck assembly and the substrate chuck, until the separation front propagates along the entire perimeter of the cured layer;
continuing to apply the force to at least one of the plate chuck assembly and the substrate chuck in the direction away from the other, until the plate does not contact the cured layer; and
processing the cured formable material to make the article.

* * * * *